(12) United States Patent
Urushima

(10) Patent No.: US 6,791,195 B2
(45) Date of Patent: Sep. 14, 2004

(54) SEMICONDUCTOR DEVICE AND MANUFACTURING METHOD OF THE SAME

(75) Inventor: Michitaka Urushima, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 123 days.

(21) Appl. No.: 09/839,298

(22) Filed: Apr. 23, 2001

(65) Prior Publication Data

US 2001/0036711 A1 Nov. 1, 2001

(30) Foreign Application Priority Data

Apr. 24, 2000 (JP) ........................................ 2000-123306

(51) Int. Cl.[7] .............................................. H01L 23/48
(52) U.S. Cl. ...................................................... 257/783
(58) Field of Search ............................... 257/678, 684, 257/686, 723, 737, 777, 778, 685, 688, 690, 730, 733, 779, 782, 783, 786; 174/259; 361/750, 771, 783

(56) References Cited

U.S. PATENT DOCUMENTS

| 4,612,083 A | * | 9/1986 | Yasumoto et al. ........... 156/633 |
| 5,579,573 A | * | 12/1996 | Baker et al. ................... 29/840 |
| 5,783,870 A | * | 7/1998 | Mostafazadeh et al. ..... 257/791 |
| 6,005,292 A | * | 12/1999 | Roldan et al. ............... 257/777 |
| 6,114,187 A | * | 9/2000 | Hayes .......................... 438/106 |
| 6,181,569 B1 | * | 1/2001 | Chakravorty ................ 361/761 |
| 6,285,081 B1 | * | 9/2001 | Jackson ........................ 257/738 |

FOREIGN PATENT DOCUMENTS

| JP | 5-3183 | 1/1993 |
| JP | 06-204290 | 7/1994 |
| JP | 8-102474 | 4/1996 |
| JP | 08-236665 | 9/1996 |
| JP | 08-264540 | 10/1996 |
| JP | 09-232379 | 9/1997 |
| JP | 09-232506 | 9/1997 |
| JP | 10-233414 | 9/1998 |
| JP | 10-242333 | 9/1998 |
| JP | 10-294335 | 11/1998 |
| JP | 11-26642 | 1/1999 |
| JP | 11-087425 | 3/1999 |
| JP | 11-135577 | 5/1999 |
| JP | 11-168185 | 6/1999 |
| JP | 11-191574 | 7/1999 |
| JP | 11-214448 | 8/1999 |

(List continued on next page.)

OTHER PUBLICATIONS

Capote et al., "Reflow–Curable Polymer Fluxes for Flip Chip Encapsulation", 1998 International Symposium on Advanced Packaging Materials, pp. 6–11.*
Australian Written Opinion dated Oct. 14, 2002.
Korean Office Action dated Oct. 30, 2002 with translation.
Japanese Office Action dated Nov. 26, 2003 with a partial English translation.

*Primary Examiner*—Kamand Cuneo
*Assistant Examiner*—Scott B. Geyer
(74) *Attorney, Agent, or Firm*—McGinn & Gibb, PLLC

(57) ABSTRACT

Semiconductor device 3 comprises semiconductor chip 11, Au ball bumps 21 formed on pad electrodes 12 with a stud bump method, and thermoplastic adhesive layer 22 provided on the surface of semiconductor chip 11 on which pad electrodes 12 are formed, in which the tops of Au ball bumps 21 project from the surface of adhesive layer 22. Reliable bonding can be realized by forming the bumps for electrical connection and the adhesive resin having an adhesion function on the semiconductor chip. In addition, the present invention provides a method of bonding a copper foil to a semiconductor wafer to form a wiring pattern, a multi chip module in which electrical connection is established by bumps bonded to each other through an adhesive layer, and the like.

9 Claims, 14 Drawing Sheets

FOREIGN PATENT DOCUMENTS

| | | |
|---|---|---|
| JP | 11-297750 | 10/1999 |
| JP | 2000-012622 | 1/2000 |
| JP | 2000-022027 | 1/2000 |
| JP | 2000-058587 | 2/2000 |
| JP | 2001-510944 | 8/2001 |
| JP | 2001-284382 | 10/2001 |
| WO | WO 99/04430 | 1/1999 |

* cited by examiner

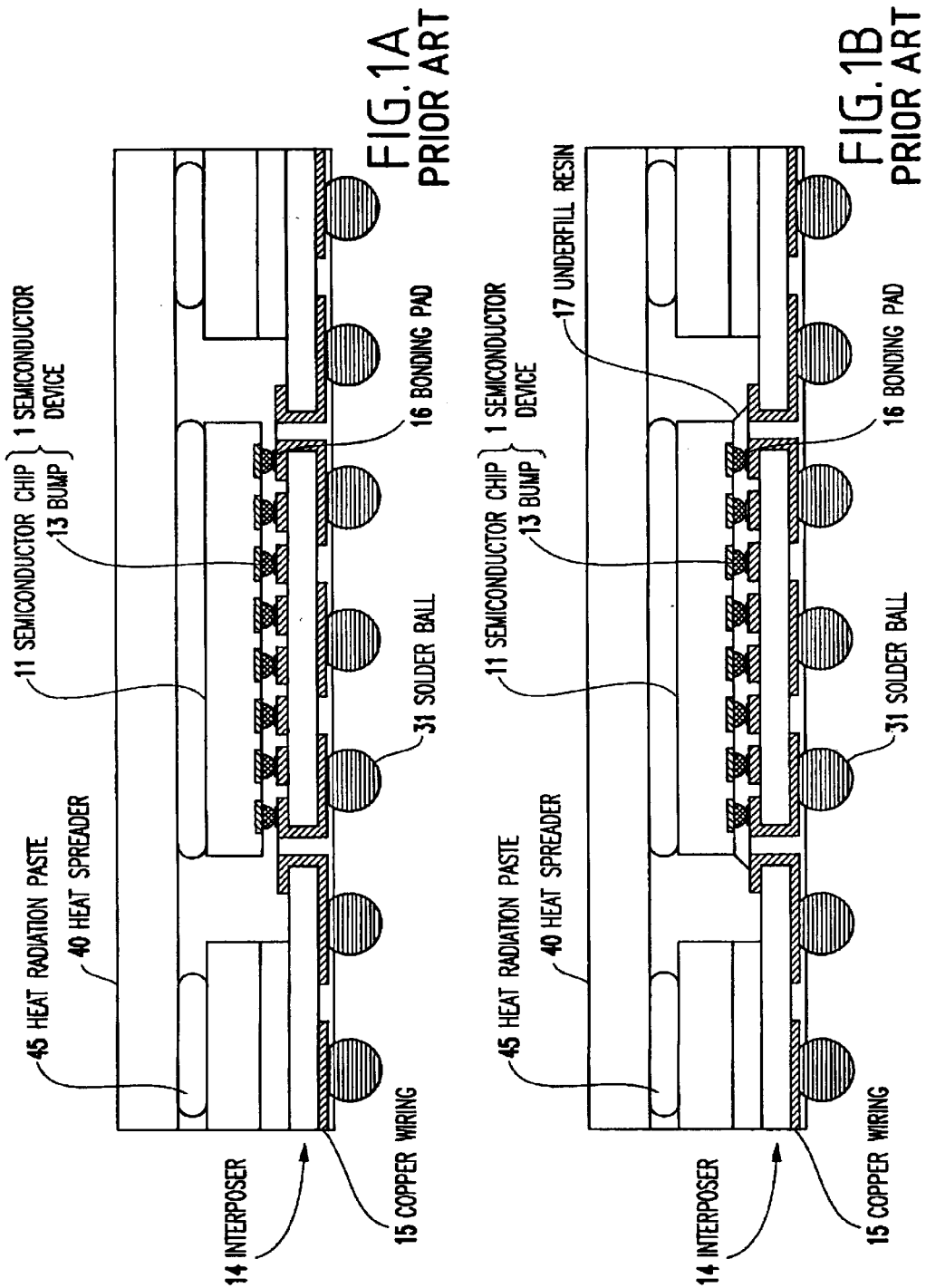

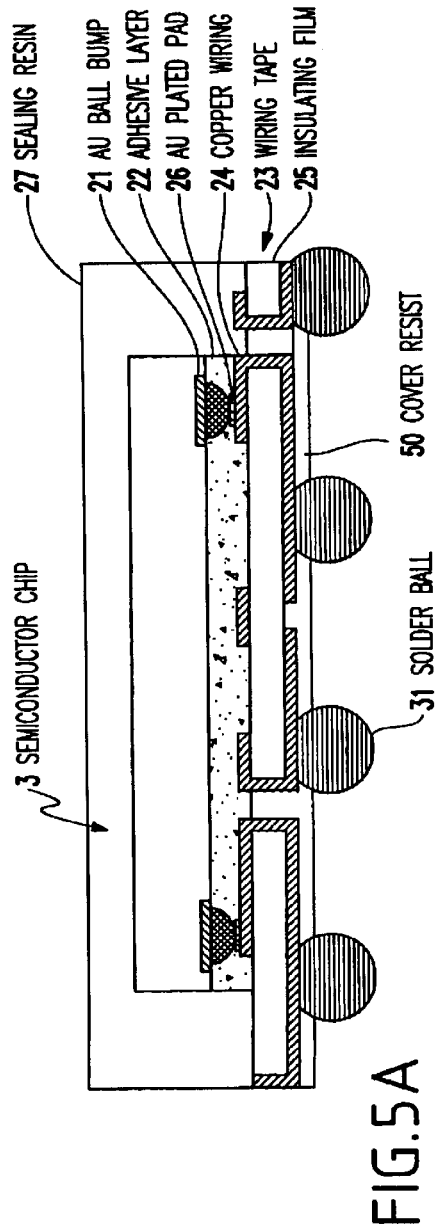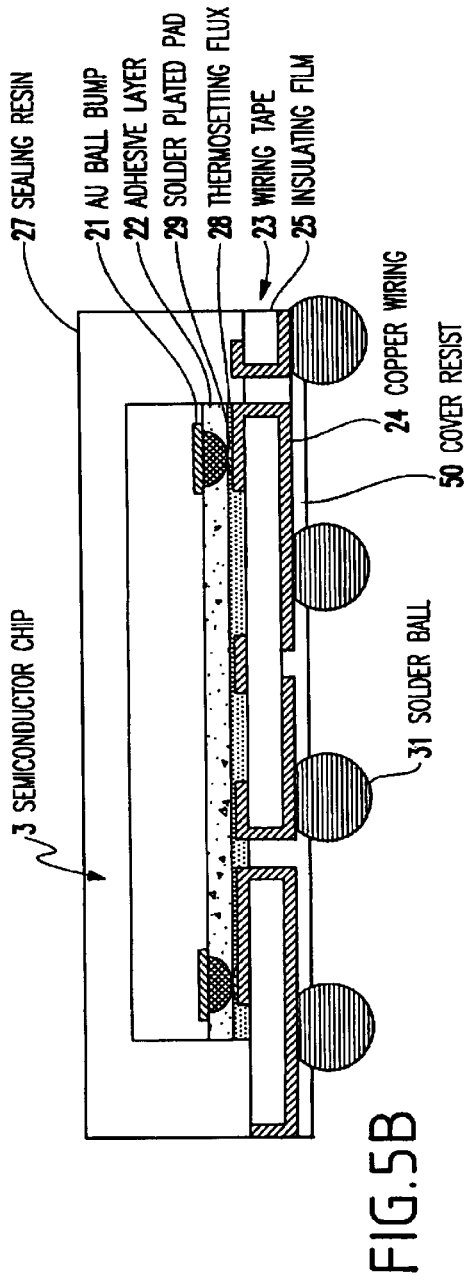
FIG.5A
FIG.5B

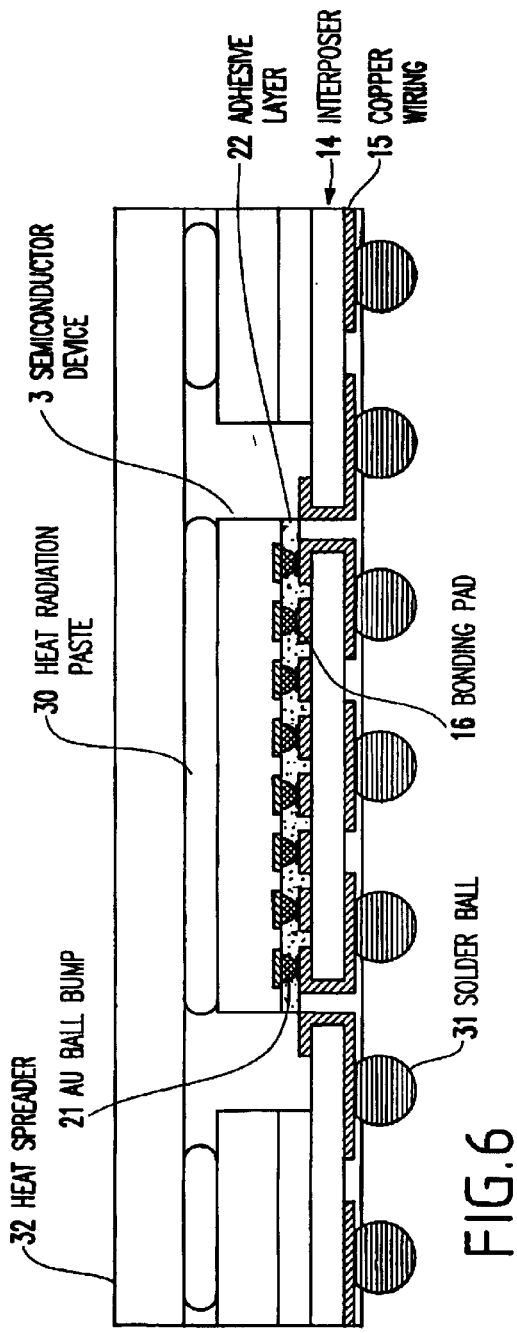
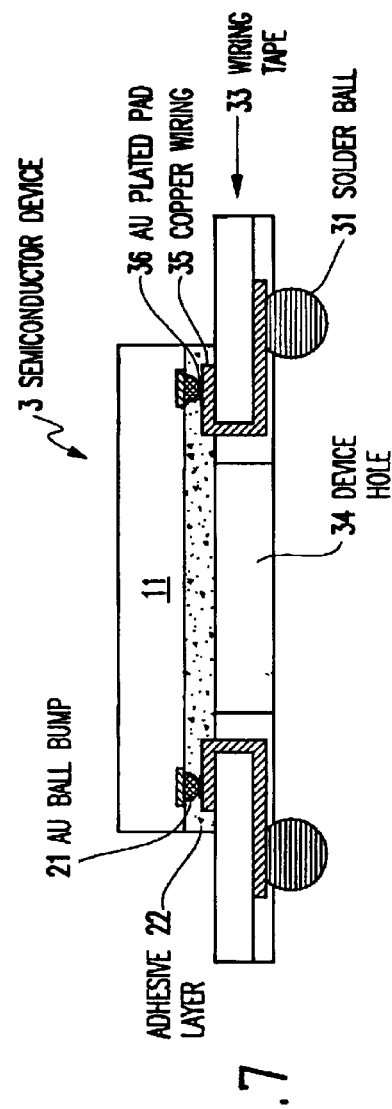

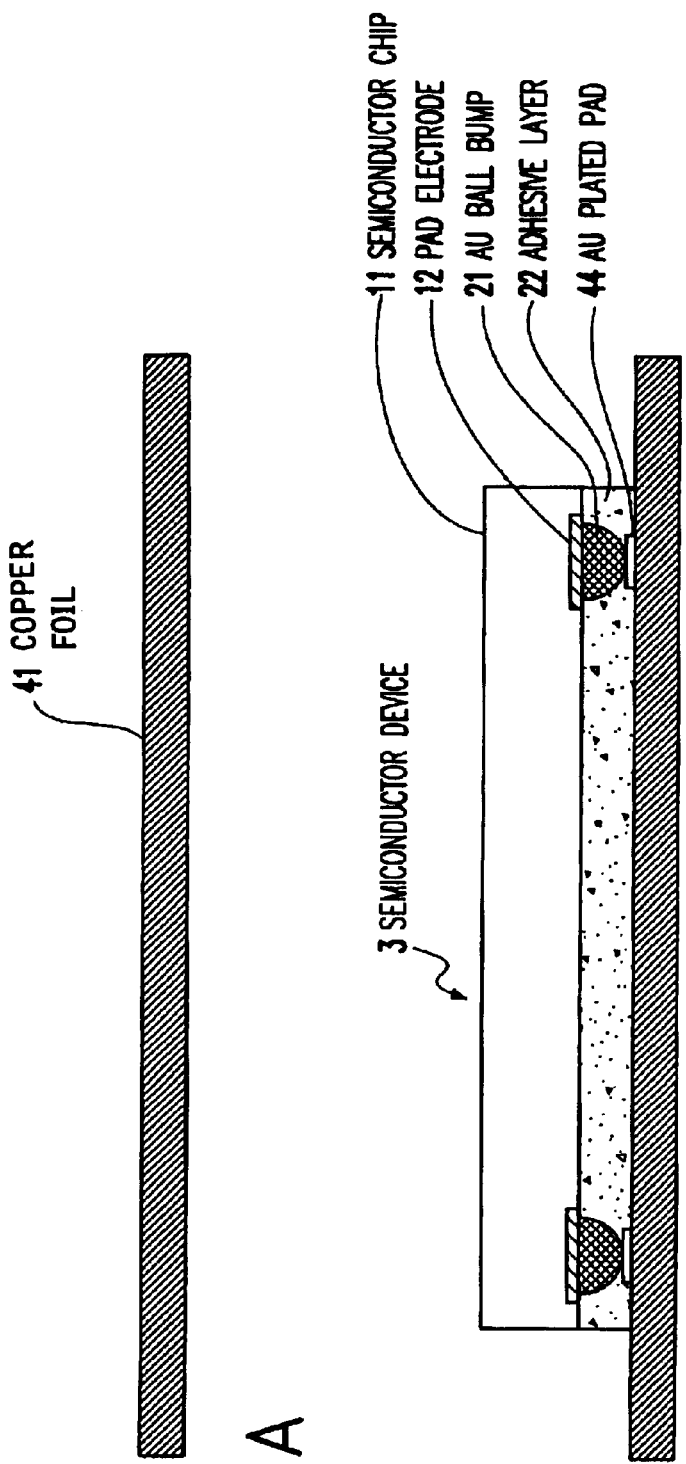

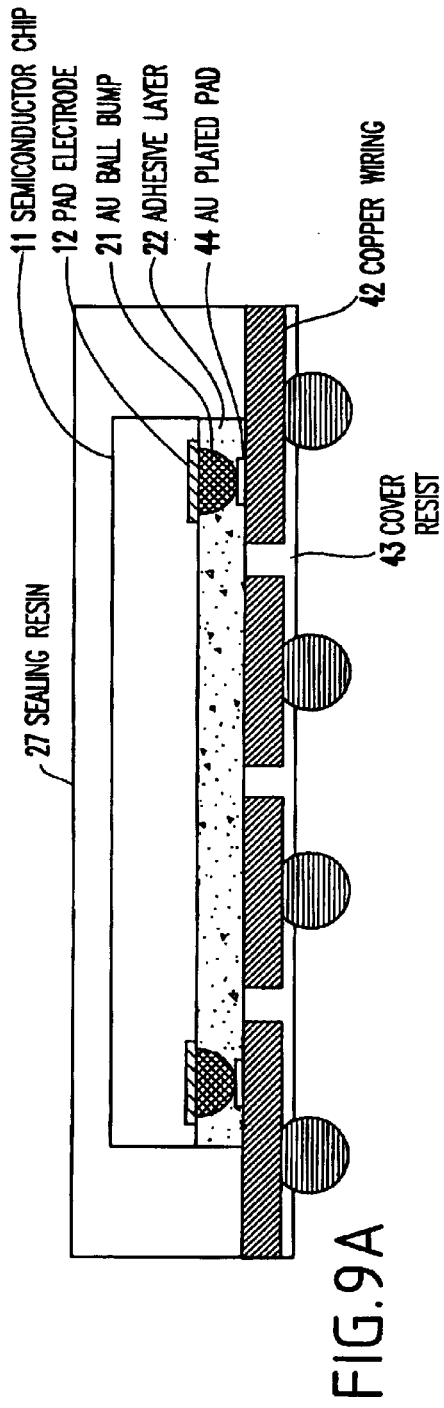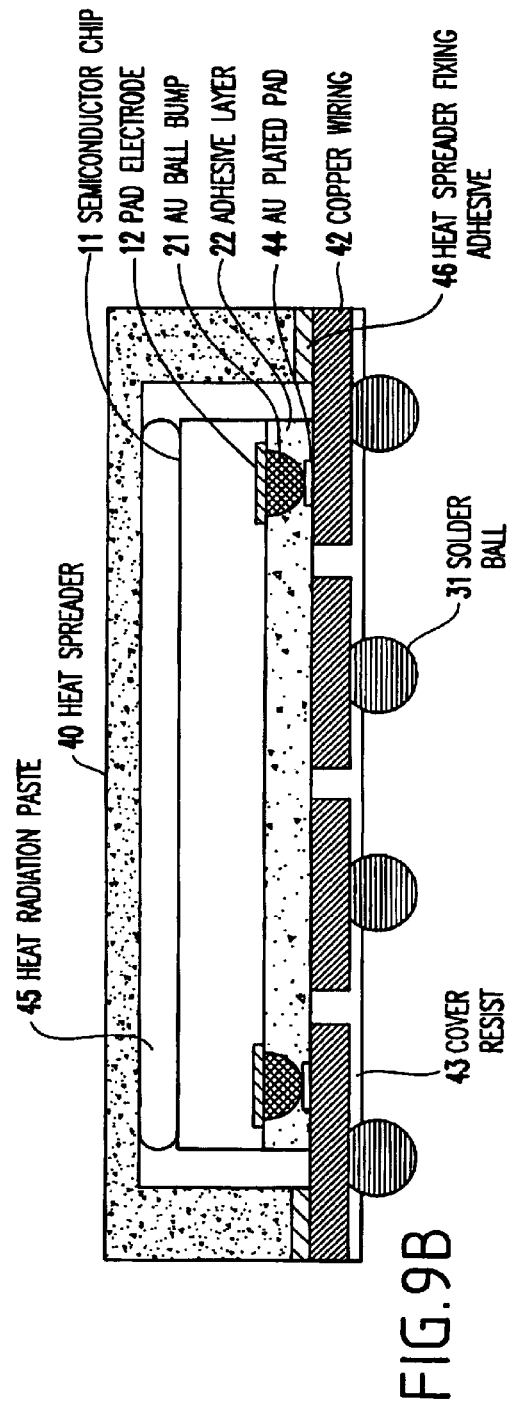

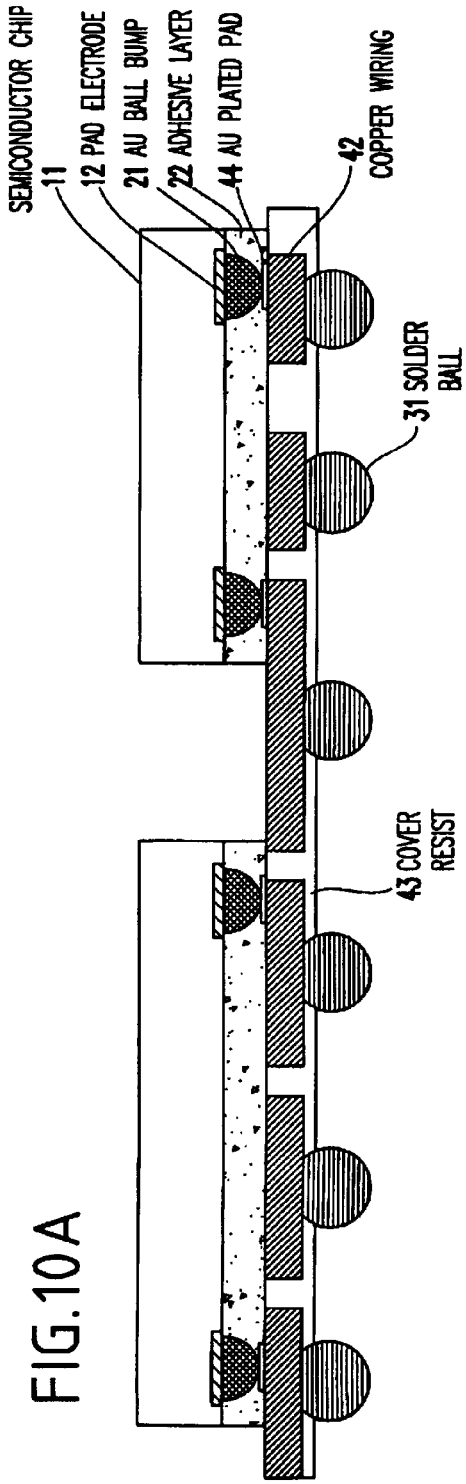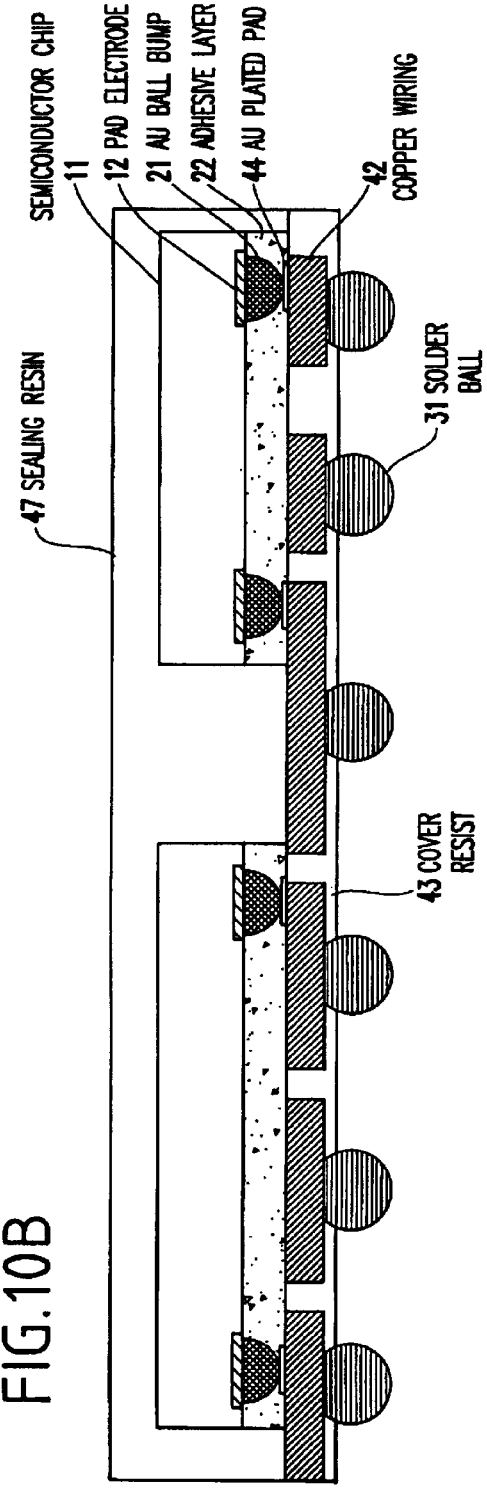

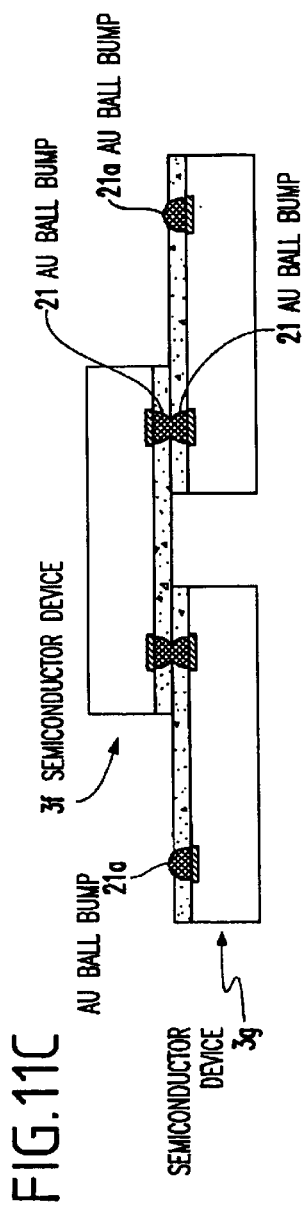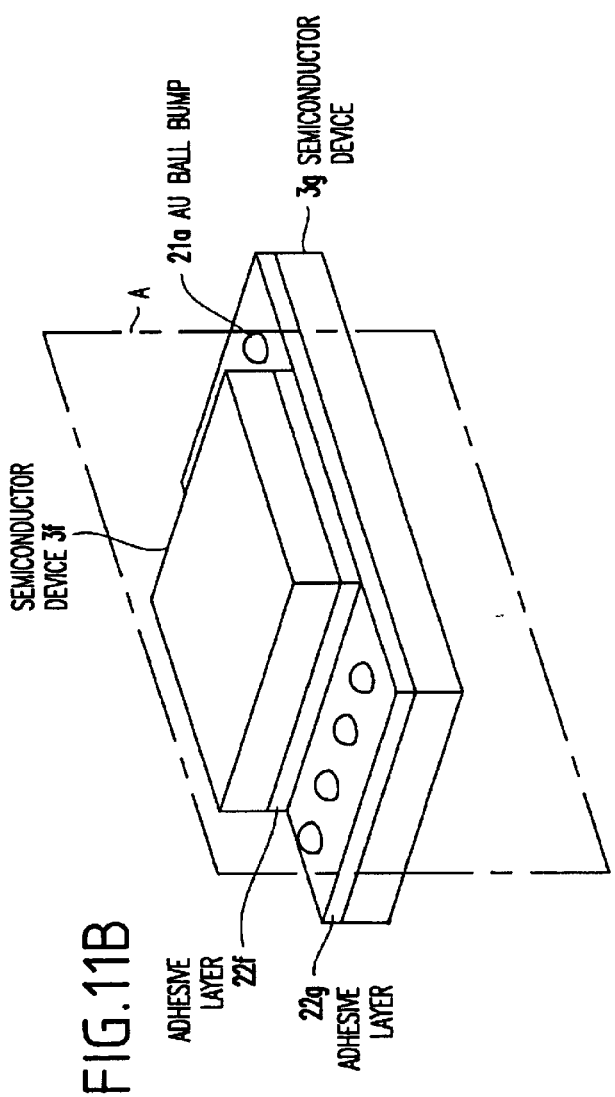

SEMICONDUCTOR DEVICE AND MANUFACTURING METHOD OF THE SAME

BACKGROUND OF THE INVENTION

1. Field of the Invention

The present invention relates to a semiconductor device and a manufacturing method thereof, and more particularly to a high-density type semiconductor device (HDP: High Density Package) of a flip-chip method, a semiconductor device (especially, CSP: Chip Size (Scale) Package) including an HDP mounted on an interposer and a multi chip module (MCM: Multi Chip Module, stacked MCP: Multi Chip Package) including a plurality of HDPs, and a manufacturing method thereof.

2. Description of the Related Art

In recent years, research and development work has been conducted on a higher density of mounting in a semiconductor device, and a number of structures and methods have been proposed for package forms or mounting methods. The forms are transitioning from QFPs (Quad Flat Package) which are a typical conventional semiconductor package to BGA (Ball Grid Array) packages of an area array type in response to the needs of an increase in number of pins and a reduction in size and weight. A high-density semiconductor package called a CSP with a reduced package size substantially equal to a chip size has been employed often in electrical equipment of small size.

At present, three kinds of interposers are mainly used in these BGA and CSP: a wiring tape made of polyimide or the like, a printed circuit board of a printed wiring board type made of glass epoxy or the like, and a ceramic substrate. The interposers serve to electrically and mechanically connect a semiconductor chip with a substrate on which the chip is to be mounted.

A flip chip technique is an ideal technique for mounting semiconductor chips onto an interposer at a high density. FIG. 1(a) is a cross section of a conventional flip chip BGA using the flip chip technique. The flip chip technique employs semiconductor device 1 having bumps (projecting electrodes) 13 formed on electrodes 12 of semiconductor chip 11. Bumps 13 are made of Au, Cu, Pb—Sn or the like, and formed with photolithography and plating. Semiconductor device 1 is bonded face down to interposer 14. At that point, bumps 13 are electrically connected through metal junction to bonding pads 16 formed at respective portions of copper wiring 15 on the surface of interposer 14. According to the flip chip technique, an increased number of pins, a reduced area for mounting, a higher speed of signal processing can be realized in semiconductor chips.

In such flip chip mounting, however, a difference in thermal expansion between semiconductor chip 11 and interposer 14 may concentrate stress on the junctions between semiconductor device 1 and interposer 14 to cause faulty connections when semiconductor device 1 is mounted on interposer 14. For this reason, sufficient reliability is difficult to ensure. It is thus essential that efforts are made to ensure reliability of mounting and a defective item after mounting can be replaced individually.

To ensure such mounting reliability, an underfill technique has been developed for filling a protection resin between semiconductor chip 11 and interposer 14. FIG. 1(b) is a cross section of a conventional flip chip BGA using the flip chip technique and the underfill technique. The underfill technique is realized such that after semiconductor device 1 is mounted on interposer 14, underfill resin 17 such as an epoxy resin is filled between semiconductor chip 11 and interposer 14 to protect the surface of semiconductor chip 11 and to reinforce the surroundings of bumps 13, thereby achieving higher reliability of connection.

The underfill technique, however, involves a problem in that a smaller pitch of electrodes 12 (fine pitch), an accompanying smaller size of bumps 13, and a smaller gap between semiconductor chip 11 and interposer 14 result in difficulties in completely filling underfill resin 17 between semiconductor chip 11 and interposer 14 and in checking whether or not any unfilled portion (void) is present after mounting.

A method capable of solving such a problem is disclosed, for example, in Japanese Patent Laid-open Publication No. 5-3183. In the method disclosed in Japanese Patent Laid-open Publication No. 5-3183, as shown in FIG. 2, bumps 13 are first provided on electrodes 12 of many semiconductor chips 11 which are allocated to semiconductor wafer 20 (FIG. 2(b)). Next, a resin is applied to the surface of semiconductor wafer 20 (semiconductor chip 11) to form protection film 18. Then, protection film 18 is cured (FIG. 2(c)). Next, the back of semiconductor wafer 20 (semiconductor chip 11) is polished to thin the chip (FIG. 2(d)). Protection film 18 is polished to expose the surfaces of bumps 13, thereby completing semiconductor device 2.

When semiconductor device 2 is mounted on an interposer, bumps are provided also on the interposer for bonding to bumps 13.

In this method, the surface of semiconductor chip 11 is covered and protected securely. Only good items can be mounted on an interposer by performing electrical selection, and the method is suitable for providing a smaller thickness since the polishing of semiconductor wafer 20 (semiconductor chip 11) after the formation of protection resin 18 can produce a thin chip of up to approximately 50 $\mu$m. In addition, even when any defect occurs after the mounting on an interposer, replacement is readily made individually since the device is not completely fixed to the interposer by an epoxy resin or the like.

On the other hand, Japanese Patent Laid-open Publication No. 11-26642 discloses a method in which semiconductor device 70 having bumps 80, adhesive sheet 98 having through-holes 102, and interposer 72B having connection holes 96 are manufactured individually before they are assembled. According to the method, after bumps 80 are aligned with connection holes 96, adhesive sheet 98 is interposed between semiconductor device body 70 and interposer 72B such that through-holes 102 are interposed between opposing bumps 80 and connection holes 96. Semiconductor device 70 is pressed against interposer 72B, bumps 80 are passed through through-holes 102 and connected to connection holes 96, and they are bonded and fixed to each other (see FIG. 3).

In addition, Japanese Patent Laid-open Publication No. 11-26642 discloses a method in which an anisotropic conductive film is used instead of adhesive sheet 98.

Japanese Patent Laid-open Publication No. 8-102474 discloses a method in which after an adhesive is applied to a main surface of a semiconductor chip on which electrodes are formed, part of the adhesive on the electrodes is removed to form holes in the adhesive layer through which the electrodes are exposed, and then bumps are filled into the holes. According to the method, the adhesive layer is formed of a photosensitive resin such as polyimide or epoxy on the entire one surface of the semiconductor wafer, and the holes are formed through chemical etching in the portions of the adhesive layer where the electrode pads are to be exposed. Then, metal such as Au is filled into the holes through plating or the like.

The aforementioned prior arts, however, have the following problems.

In the method disclosed in Japanese Patent Laid-open Publication No. 5-3183, bumps 13 and semiconductor chip 11 fixed by protection film 18 provide reliability in the junction surface of semiconductor chip 11 and bumps 13 at the time of mounting on a substrate. In mounting on various interposers, however, sufficient reliability cannot be ensured for bonding to such interposers. Also, thinner semiconductor chip 11 may cause thermal stress and warp stress applied to semiconductor chip 11 from the junction to destroy semiconductor chip 11 itself. This is because thermal stress and mechanical stress at the time of mounting on various interposers applied only to connection terminals (bumps) result in high dependence on the arrangement of the terminals, the number of pins, the size of a chip (package), the thickness of the chip and the like.

To ensure reliability of the bonding, the need of injecting an underfill resin arises. In this case, however, the mounting structure is complicated and the number of mounting steps is increased to cause a higher cost. In addition, as described above, it is difficult to inject the underfill resin between a semiconductor chip and an interposer, and especially for a number of pins of 1000 or more, voids occur frequently and an expensive substrate is readily changed to an unuseful material.

According to the method disclosed in Japanese Patent Laid-open Publication No. 11-26642, if mounting is favorably performed, adhesive sheet 98 is adhered to both semiconductor device 70 and interpose 72B and reinforces the surroundings of bumps 80, thereby making it possible to ensure reliability of bonding.

It is difficult, however, to control the position of adhesive sheet 98 such that through-holes 102 are accurately placed between opposing bumps 80 and connection holes 96. Since such accurate arrangement is more difficult especially as a semiconductor device is miniaturized with a finer pitch of electrodes and smaller bumps, miniaturization of semiconductor devices is obstructed. Additionally, since a member for reinforcing the surroundings of bumps 80 from before mounting is desired but not present, a load is applied on bumps 80 at the pressing to readily cause faulty connection. While the positioning of the sheet is not required when an anisotropic conductive film is used, a load applied on the bumps at the pressing also tends to cause faulty connection. Furthermore, in general, an anisotropic conductive film is not so inexpensive.

Thus, according to the method disclosed in Japanese Patent Laid-open Publication No. 11-26642, it is difficult to reliably mount at low cost a semiconductor device with electrodes of high density, for example having 1000-pin electrodes formed in an area of 10 mm×10 mm.

In the method disclosed in Japanese Patent Laid-open Publication No. 8-102474, after the holes are formed in the adhesive layer on the main surface of the semiconductor chip on which the electrodes are formed, the bumps are filled into the holes. Thus, a stud bump method, which is an application of a wire bonding technique cannot be used. The inability to use the wire bonding technique presents a problem of failing to have the capability of dealing with individual cases and making it difficult to perform flexible manufacturing.

On the other hand, polyimide, BT resin, ceramic and the like as a base material of an interposer are expensive to raise concern about a high proportion of its cost to the product price. Thus, inexpensive alternative means or method is desired.

A conventional BGA type semiconductor package of a flip chip method employs a build-up BT substrate as an interposer to support a significantly small pad pitch of 200 μm of a semiconductor chip. The build-up BT substrate, however, is expensive to raise concern about a high proportion of its cost to the product price. Thus, inexpensive alternative means or method is desired.

SUMMARY OF THE INVENTION

The present invention has been made in view of the aforementioned prior art problems, and it is an object thereof to enable reliably mounting of a high-density type semiconductor device having a small pitch equal to a bare chip on an interposer or a mounting substrate (hereinafter referred to as "interposer")) with flip chip bonding for forming and connecting metal bumps between electrodes (bonding pads) of a semiconductor chip and leads, and to provide a semiconductor device at low cost by providing a simpler mounting structure, easier mounting, a reduced number of mounting steps, and improved yields.

It is another object of the present invention to facilitate replacement after mounting.

It is a further object of the present invention to provide a semiconductor device at low cost by some ideas for an interposer manufacturing method to reduce the number of steps and material cost.

It is another object of the present invention to reliably provide at low cost a multi chip module assembled by using a plurality of high-density type semiconductor device equal to a bare chip.

To achieve the aforementioned objects, according to a first aspect of the present invention, there is provided a semiconductor device comprising a semiconductor chip, a stud bump provided on an electrode of the semiconductor chip, and an adhesive layer provided on the surface of the semiconductor chip on which the electrode is formed, wherein the stud bump projects from a surface of the adhesive layer.

According to the semiconductor device of the first aspect of the present invention, since the stud bump is selected, the wire bonding technique can be applied. Thus, the semiconductor device has the advantage of the capability of dealing with individual cases to readily allow flexible manufacture.

The stud bump can be thermocompression-bonded to a lead on an interposer or the like as it is (without providing a bump on the lead) since the bump projects from the surface of the adhesive layer. Also, the adhesive layer reinforces the stud bump from the surroundings and no load is applied on the stud bump at the time of mounting. In addition, when the semiconductor device is mounted on an interposer or the like, the adhesive layer provides complete sealing between the semiconductor chip and the interposer.

Therefore, the semiconductor chip of the first aspect has advantages of ensuring sufficient reliability without using an underfill, allowing easy mounting of a high-density type semiconductor device having a small pitch equal to a bare chip on an interposer or the like with a simple structure and simple steps, providing improved yields, and enabling manufacture at low cost.

According to a second aspect of the present invention, there is provided a semiconductor device obtained by bonding the semiconductor device according to the first aspect of the present invention to an interposer through thermocompression bonding.

Thus, the semiconductor device according to the second aspect of the present invention has advantages of high reliability and low cost as described above due to the use of the semiconductor device of the first aspect of the present invention. When two or more semiconductor devices are bonded, an MCM of high-density packaging can be obtained.

According to a third aspect of the present invention, there is provided a semiconductor device comprising a semiconductor chip, a protection resin layer provided on the surface of the semiconductor chip on which an electrode is formed, a bump provided on the electrode of the semiconductor chip and exposed at a surface of the protection resin layer, and an interposer adhered to the surface of the protection resin layer through a cured flux and electrically connected to the bump.

Thus, the semiconductor device according to the third aspect of the present invention has the advantage of fixing the semiconductor chip securely to the interposer to ensure high reliability of bonding since the cured flux is provided between the protection resin layer and the interposer such that the flux is bonded to both of them. A thermosetting flux used for connection of the bump to the interposer adds no steps or need of an underfill.

According to a fourth aspect of the present invention, there is provided a semiconductor device obtained by providing a device hole in the interposer in the semiconductor device of the second or third aspect of the present invention.

The device hole refers to a hole provided in the surface of the interposer on which the semiconductor chip is mounted, except the area on which pad electrodes are mounted.

Thus, the semiconductor device according to the fourth aspect of the present invention has the advantage of being capable of preventing damage to the interface between the interposer and the adhesive layer due to the popcorn phenomenon since the interposer is provided with the device hole, and the advantage of eliminating the need of filling or providing a protection resin such as an underfill after the mounting of the semiconductor chip on the interposer since the surface of the semiconductor chip exposed through the device hole is resin-sealed by the adhesive layer.

According to a fifth aspect of the present invention, there is provided a semiconductor device comprising a semiconductor chip, an adhesive layer provided on the surface of the semiconductor chip on which an electrode is formed, a bump provided on the electrode of the semiconductor chip and exposed at a surface of the adhesive layer, a wiring pattern adhered to the surface of the adhesive layer and partially bonded to the bump, and an insulating and covering layer for insulating and covering the wiring pattern and selectively opening to form an external connecting portion.

In the semiconductor device according to the fifth aspect of the present invention, since only the wiring pattern and the insulating and covering layer correspond to an interposer, an expensive material such as polyimide, BT resin, or ceramic used as a base material of the interposer is not used and it is possible to provide the function of the interposer, i.e. the function of being interposed between the semiconductor chip and the mounting substrate to provide terminals arranged with a greater pitch than that of the pad electrodes for allowing mounting on the mounting substrate. As a result, the semiconductor device has the advantage of eliminating the need of using an existing interposer to enable manufacture at low cost.

In addition, the semiconductor device has the advantage of fixing the wiring pattern with the adhesive layer to ensure high reliability of bonding.

According to a sixth aspect of the present invention, there is provided a semiconductor device comprising a semiconductor chip, a protection resin layer provided on the surface of the semiconductor chip on which an electrode is formed, a bump provided on the electrode of the semiconductor chip and exposed at a surface of the protection resin layer, a wiring pattern adhered to the surface of the protection resin layer through a cured flux and partially bonded to the bump, and an insulating and covering layer for insulating and covering the wiring pattern and selectively opening to form an external connecting portion.

In the semiconductor device according to the sixth aspect of the present invention, since only the wiring pattern and the insulating and covering layer correspond to an interposer, an expensive material such as polyimide, BT resin, or ceramic used as a base material of the interposer is not used and it is possible to provide the function of the interposer, i.e. the function of being interposed between the semiconductor chip and the mounting substrate to provide terminals arranged with a greater pitch than that of the pad electrodes for allowing mounting on the mounting substrate. As a result, the semiconductor device has the advantage of eliminating the need of using an existing interposer to enable manufacture at low cost.

In addition, the semiconductor device has the advantage of fixing the wiring pattern with the cured flux to ensure high reliability of bonding. A thermosetting flux used for connection of the bump to the wiring pattern adds no steps or need of an underfill.

According to a seventh aspect of the present invention, there is provided a semiconductor apparatus (multi chip module) comprising, two or more semiconductor devices, each of the devices including a semiconductor chip, an adhesive layer provided on the surface of the semiconductor chip on which an electrode is formed, and a bump provided on the electrode of the semiconductor chip and exposed at a surface of the adhesive layer, wherein part of the surface of one of the semiconductor devices on which the adhesive layer is provided is bonded to part or all of the surface of another one of the semiconductor devices on which the adhesive layer is provided and they are electrically connected to each other with the bumps at the bonding surface.

The semiconductor apparatus according to the seventh aspect of the present invention is a multi chip module obtained by bonding the semiconductor chips such that the surfaces thereof on which the electrodes are formed are bonded to each other, and has advantages of high packaging density and ensuring high reliability of bonding with the adhesive layer. It is possible that an interposer or the like is adhered to the surface of the semiconductor device on which the adhesive layer is formed except the bonding surface of the semiconductor chips to bond the bump to a lead of the interposer in that area for mounting.

According to an eighth aspect of the present invention, there is provided a semiconductor apparatus (multi chip module) comprising, two or more stacked semiconductor devices, each of the devices including a semiconductor chip having electrodes formed on the front and back, an adhesive layer provided on the front or back of the semiconductor chip, and a bump provided on the electrode of the semiconductor chip and exposed at a surface of the adhesive layer, wherein upper one of the semiconductor devices is bonded to lower one of the semiconductor devices with the adhesive layer and the electrodes thereof are connected to each other through the bump.

The semiconductor apparatus according to the eighth aspect of the present invention is a multi chip module obtained by bonding and stacking a plurality of the semiconductor chips and establishing electrical conduction through the bumps, and has advantages of high packaging density and ensuring high reliability of bonding with the adhesive layer.

According to a ninth aspect of the present invention, there is provided a semiconductor device including a thermoplastic resin with adhesion as the adhesive layer in the semiconductor device according to the first, second, fifth, seventh, or eighth aspect of the present invention.

Thus, the semiconductor device according to the ninth aspect of the present invention has the advantage of allowing individual replacement of a defective semiconductor chip after bonding since the adhesive layer is formed of the thermoplastic resin with adhesion and the semiconductor chip can be separated from the base material by heat applied to the adhesive layer. Particularly, since a defective item can be replaced even after a number of semiconductor chips are mounted on a single wiring substrate, the wiring substrate is not wasted.

According to a tenth aspect of the present invention, there is provided a method of manufacturing a semiconductor device, comprising the steps of:

forming a predetermined number of semiconductor chips on a semiconductor wafer and providing a bump on an electrode of each of the semiconductor chips;

forming an adhesive layer on the surface on which the bump is provided;

etching an entire surface of the adhesive layer until the bump projects; and cutting the semiconductor wafer for division into each of the semiconductor chips.

Thus, the method of manufacturing a semiconductor chip according to the tenth aspect of the present invention allows manufacture of a semiconductor device with a simple process which can readily realize reliable mounting to provide adhesion and electrical connection to the interposer or the like and to seal the junction.

Since the adhesive layer is formed after the provision of the bump, it is not necessary to bore a hole in the adhesive layer and perform some processing. It is thus not necessary to form the adhesive layer through a number of processes such as mask design with a lithography technique, resist application, exposure, development, and etching. Required processing is providing the adhesive layer and etching after the provision of the bump by using the wire bonding technique.

According to an eleventh aspect of the present invention, there is provided a method of manufacturing a semiconductor device, comprising the steps of:

forming a predetermined number of semiconductor chips on a semiconductor wafer and providing a bump on an electrode of each of the semiconductor chips;

forming an adhesive layer on the surface on which the bump is provided;

etching an entire surface of the adhesive layer until the bump projects;

cutting the semiconductor wafer for division into each of the semiconductor chips; and mounting one, or two or more of the semiconductor chips on a single wiring substrate, and performing heating and pressing for adhesion to the wiring substrate with the adhesive layer and electrical connection to wiring on the wiring substrate with the bump.

Thus, the method of manufacturing a semiconductor device according to the eleventh aspect of the present invention provides advantages similar to those from the tenth aspect of the present invention and advantages of a significant reduction in the number of steps for manufacturing a semiconductor package and a significant reduction in the time required for the steps since the adhesion and electrical connection to an interposer are simultaneously performed to simultaneously achieve inner lead bonding of all electrodes on the semiconductor chip, and adhesion of the semiconductor chip to the wiring substrate and sealing of the junction surface.

For example, when 30 semiconductor devices each with 1000-pin electrodes on a wiring substrate are mounted, a conventional signal point bonding method takes a total of 3000 seconds assuming that bonding takes 0.1 second per electrode. According to the eleventh aspect of the present invention, however, bonding is completed in approximately 10 to 20 seconds, and adhesion is also completed at the same time, thereby achieving great advantages in terms of time and economics.

In addition, the adhesive layer can provide high reliability of bonding to eliminate the need of using an underfill.

It should be noted that the wiring substrate corresponds to a wiring tape, a plastic substrate, a ceramic substrate, a lead frame or the like.

According to a twelfth aspect of the present invention, there is provided a method of manufacturing a semiconductor device, comprising the steps of:

forming a predetermined number of semiconductor chips on a semiconductor wafer and providing a bump on an electrode of each of the semiconductor chips;

forming a protection resin layer on the surface on which the bump is provided;

etching an entire surface of the protection resin layer until the bump projects;

cutting the semiconductor wafer for division into each of the semiconductor chips;

for one, or two or more of the semiconductor chips, applying a thermosetting flux to the bump and the protection resin layer or to a wiring substrate corresponding thereto;

disposing the bump on wiring of the wiring substrate; and performing heating to solder the bump to the wiring and cure the thermosetting flux.

The method of manufacturing a semiconductor device according to the twelfth aspect of the present invention provides advantages of a significant reduction in the number of steps for manufacturing a semiconductor package and a significant reduction in the time required for the steps similarly to the eleventh aspect of the present invention since the bump is bonded to the wiring on the wiring substrate with reflow and the cured flux interposed between the protection resin layer and the wiring substrate bonds the semiconductor chip to the wiring substrate to simultaneously achieve the adhesion and electrical connection to an interposer.

In addition, the cured flux can provide high reliability of bonding to eliminate the need of using an underfill.

According to a thirteenth aspect of the present invention, there is provided a method of manufacturing a semiconductor device, comprising the steps of:

forming a predetermined number of semiconductor chips on a semiconductor wafer and providing a bump on an electrode of each of the semiconductor chips;

forming an adhesive layer on the surface on which the bump is provided;

etching an entire surface of the adhesive layer until the bump projects; and bonding the semiconductor wafer to a wiring substrate through the adhesive layer and cutting the semiconductor chip along its perimeter for division into each of the semiconductor chips.

The method of manufacturing a semiconductor device according to the thirteenth aspect of the present invention has the advantage of reducing two dicing steps for the semiconductor wafer and for the wiring substrate to one since the semiconductor chip is cut with the wiring substrate bonded thereto.

The method of manufacturing a semiconductor device according to the thirteenth aspect of the present invention allows simple manufacture of a CSP in which a semiconductor chip and an interposer have the same area and are completely stacked. For manufacturing a flange type semiconductor package including an interposer with its area larger than that of a semiconductor chip, a semiconductor chip may be mounted on a wiring substrate after division into each of semiconductor chips as in the eleventh aspect of the present invention.

In addition, the adhesive layer can provide high reliability of bonding to eliminate the need of using an underfill.

According to a fourteenth aspect of the present invention, there is provided a method of manufacturing a semiconductor device, comprising the steps of:

forming a predetermined number of semiconductor chips on a semiconductor wafer and providing a bump on an electrode of each of the semiconductor chips;

forming an adhesive layer on the surface on which the bump is provided;

etching an entire surface of the adhesive layer until the bump projects;

aligning the semiconductor wafer with a wiring substrate through the adhesive layer, and performing heating and pressing for adhesion to the wiring substrate with the adhesive layer and electrical connection to wiring on the wiring substrate with the bump;

cutting the semiconductor chip along its perimeter for division into each of the semiconductor chips.

The method of manufacturing a semiconductor chip according to the fourteenth aspect of the present invention provides advantages similar to those of the thirteenth aspect of the present invention and advantages of a significant reduction in the number of steps for manufacturing a semiconductor package and a significant reduction in the time required for the steps since the adhesion and electrical connection to an interposer are simultaneously performed to simultaneously achieve inner lead bonding of all electrodes on the semiconductor chip, and adhesion of the semiconductor chip to the wiring substrate and sealing of the junction surface. The adhesive layer can provide high reliability of bonding to eliminate the need of using an underfill.

According to a fifteenth aspect of the present invention, there is provided a method of manufacturing a semiconductor device, comprising the steps of:

forming a predetermined number of semiconductor chips on a semiconductor wafer and providing a bump on an electrode of each of the semiconductor chips;

forming a protection resin layer on the surface on which the bump is provided;

etching an entire surface of the protection resin layer until the bump projects;

applying a thermosetting flux to the bump and the protection resin layer or to a wiring substrate corresponding thereto;

disposing the bump on wiring of the wiring substrate;

performing heating to solder the bump to the wiring and cure the thermosetting flux; and cutting the semiconductor chip along its perimeter for division into each of the semiconductor chips.

The method of manufacturing a semiconductor device according to the fifteenth aspect of the present invention provides advantages similar to those of the thirteenth aspect of the present invention and advantages of a significant reduction in the number of steps for manufacturing a semiconductor package and a significant reduction in the time required for the steps similarly to the eleventh aspect of the present invention since the bump is bonded to the wiring on the wiring substrate with reflow and the cured flux interposed between the protection resin layer and the wiring substrate bonds the semiconductor chip to the wiring substrate to simultaneously achieve the adhesion and electrical connection to an interposer.

The cured flux can provide high reliability of bonding to eliminate the need of using an underfill.

According to a sixteenth aspect of the present invention, there is provided a method of manufacturing a semiconductor device, comprising the steps of:

providing a bump on an electrode of a semiconductor chip;

forming an adhesive layer on the surface on which the bump is provided;

etching an entire surface of the adhesive layer until the bump project;

bonding the semiconductor chip to a metal foil through the adhesive layer; and forming the metal foil into a wiring pattern.

The method of manufacturing a semiconductor device according to the sixteenth aspect of the present invention provides the advantage of reduced cost since the wiring pattern for connecting the semiconductor chip to a mounting substrate is formed by using the semiconductor chip as a base to eliminate the need of using an additional interposer and thus the need of the material and process thereof, and the advantage of providing a thinner semiconductor package. The adhesive layer can provide high reliability of bonding to eliminate the need of using an underfill.

According to a seventeenth aspect of the present invention, there is provided a method of manufacturing a semiconductor device, comprising the steps of:

providing a bump on an electrode of a semiconductor chip;

forming an adhesive layer on the surface on which the bump is provided;

etching an entire surface of the adhesive layer until the bump projects;

aligning the semiconductor chip with a metal foil through the adhesive layer, and performing heating and pressing for adhesion to the metal foil with the adhesive layer and electrical connection to the metal foil with the bump; and forming the metal foil into a wiring pattern.

The method of manufacturing a semiconductor device according to the seventeenth aspect of the present invention provides the advantages of the sixteenth aspect of the present invention and advantages of a significant reduction in the number of steps for manufacturing a semiconductor package and a significant reduction in the time required for the steps since the adhesion and electrical connection to the metal foil are simultaneously performed to simultaneously achieve inner lead bonding of all electrodes on the semiconductor chip, and adhesion of the semiconductor chip to the metal foil and sealing of the junction surface.

According to an eighteenth aspect of the present invention, there is provided a method of manufacturing a semiconductor device, comprising the steps of:

providing a bump on an electrode of a semiconductor chip;

forming a protection resin layer on the surface on which the bump is provided;

etching an entire surface of the protection resin layer until the bump projects;

aligning the semiconductor chip with a metal foil through the protection resin layer;

performing heating to solder the bump to the metal foil and cure a thermosetting flux; and forming the metal foil into a wiring pattern.

The method of manufacturing a semiconductor device according to the eighteenth aspect of the present invention provides advantages similar to those of the sixteenth aspect of the present invention and advantages of a significant reduction in the number of steps for manufacturing a semiconductor package and a significant reduction in the time required for the steps since the bump is bonded to the wiring on the wiring substrate with reflow and the cured flux interposed between the protection resin layer and the wiring substrate bonds the semiconductor chip to the wiring substrate to simultaneously achieve the adhesion and electrical connection to an interposer.

The cured flux can provide high reliability of bonding to eliminate the need of using an underfill.

According to a nineteenth aspect of the present invention, there is provided a method of manufacturing a semiconductor device, comprising the steps of:

forming a predetermined number of semiconductor chips on a semiconductor wafer and providing a bump on an electrode of each of the semiconductor chips;

forming an adhesive layer on the surface on which the bump is provided;

etching an entire surface of the adhesive layer until the bump projects; and boning the semiconductor wafer to a metal foil through the adhesive layer; and forming the metal foil into a wiring pattern; and then, cutting the semiconductor chip along its perimeter for division into each of the semiconductor chips.

The method of manufacturing a semiconductor device according to the nineteenth aspect of the present invention provides the advantage of reduced cost since the semiconductor chip is provided with the wiring pattern for connecting the semiconductor chip to a mounting substrate in the process on the semiconductor wafer to eliminate the need of using an additional interposer and thus the need of the material and process thereof, and the advantage of providing a thinner semiconductor package. The adhesive layer can provide high reliability of bonding to eliminate the need of using an underfill.

According to a twentieth aspect of the present invention, there is provided a method of manufacturing a semiconductor device, comprising the steps of:

forming a predetermined number of semiconductor chips on a semiconductor wafer and providing a bump on an electrode of each of the semiconductor chips;

forming an adhesive layer on the surface on which the bump is provided;

etching an entire surface of the adhesive layer until the bump projects;

aligning the semiconductor wafer with a metal foil through the adhesive layer, and performing heating and pressing for adhesion to the metal foil with the adhesive layer and electrical connection to the metal foil with the bump;

forming the metal foil into a wiring pattern; and then, cutting the semiconductor chip along its perimeter for division into each of the semiconductor chips.

The method of manufacturing a semiconductor device according to the twentieth aspect of the present invention provides the advantages of the nineteenth aspect of the present invention and advantages of a significant reduction in the number of steps for manufacturing a semiconductor package and a significant reduction in the time required for the steps since the adhesion and electrical connection to the metal foil are simultaneously performed to simultaneously achieve inner lead bonding of all electrodes on the semiconductor chip, and adhesion of the semiconductor chip to the metal foil and sealing of the junction surface.

According to a twenty-first aspect of the present invention, there is provided a method of manufacturing a semiconductor device, comprising the steps of:

forming a predetermined number of semiconductor chips on a semiconductor wafer and providing a bump on an electrode of each of the semiconductor chips;

forming a protection resin layer on the surface on which the bump is provided;

etching an entire surface of the protection resin layer until the bump projects;

aligning the semiconductor wafer with a metal foil through the protection resin layer;

performing heating to solder the bump to the metal foil and cure a thermosetting flux;

forming the metal foil into a wiring pattern; and then, cutting the semiconductor chip along its perimeter for division into each of the semiconductor chips.

The method of manufacturing a semiconductor device according to the twenty-first aspect of the present invention provides the advantages of the nineteenth aspect of the present invention and advantages of a significant reduction in the number of steps for manufacturing a semiconductor package and a significant reduction in the time required for the steps since the bump is bonded to the wiring on the wiring substrate with reflow and the cured flux interposed between the protection resin layer and the wiring substrate bonds the semiconductor chip to the wiring substrate to simultaneously achieve the adhesion and electrical connection to an interposer.

The cured flux can provide high reliability of bonding to eliminate the need of using an underfill.

According to a twenty-second aspect of the present invention, there is provided a method of manufacturing a semiconductor device of any one of the sixteenth to twenty-first aspects of the present invention, in which an insulating and covering layer is selectively formed on the wiring pattern after the metal foil is formed on the wiring pattern.

In the method of manufacturing a semiconductor device according to the twenty-second aspect of the present invention provide, the insulating and covering layer selectively formed on the wiring pattern insulates and covers the wiring pattern, and an opening in the insulating and covering layer exposes part of the wiring pattern to form an electrode (land portion) for electrical connection to the outside. The device may be used as an LGA type package.

According to a twenty-third aspect of the present invention, there is provided a method of manufacturing a semiconductor device of the twenty-second aspect of the preset invention, in which after the insulating and covering layer is selectively formed on the wiring pattern, a solder ball is provided on a land portion of the wiring pattern exposed through an opening of the insulating and covering layer.

The method of manufacturing a semiconductor device provides a BGA type package.

According to a twenty-fourth aspect of the present invention, there is provided a method of manufacturing a semiconductor device of the tenth, eleventh, thirteenth, fourteenth, sixteenth, seventeenth, nineteenth or twentieth aspect of the present invention, in which the adhesive layer is a thermoplastic resin with adhesion.

The method of manufacturing a semiconductor device according to the twenty-fourth aspect of the present invention provides the advantage of being capable of replacing a defective semiconductor chip individually after the adhesion since the adhesive layer is a thermoplastic resin with adhesion and thus the semiconductor chip can be separated from the base material by adding heat to the adhesive layer. Particularly, since a defective item can be replaced even after a number of semiconductor chips are adhered to a single wiring substrate, the method provides the advantage of preventing wasted wiring substrates.

According to a twenty-fifth aspect of the present invention, there is provided a semiconductor device comprising a semiconductor chip, an adhesive layer provided on the surface of the semiconductor chip on which an electrode is formed, a bump provided on the electrode of the semiconductor chip and exposed at a surface of the adhesive layer, a tape substrate, and an interposer, wherein the semiconductor chip is adhered to the front of the tape substrate with the adhesive layer, the semiconductor chip is electrically connected to the tape substrate with the bump, and the interposer is connected to the back of the tape substrate for allowing electrical conduction.

As described above, the present invention produces the effect of allowing low-cost manufacture of a high density package (hereinafter abbreviated as "HDP")) which realizes reliable bonding by forming the bump for electrical connection and the adhesive resin having the adhesion function on the semiconductor chip.

When the HDP is mounted on another BGA substrate or the like to manufacture a package larger than the semiconductor chip, an underfill step for injecting a resin between the semiconductor chip and the substrate is not required since the adhesive layer adheres to the BGA substrate or the like to provide sealing between the semiconductor chip and the substrate. For this reason, the HDP with a smaller pitch can be mounted reliably on an interposer or the like to achieve a simpler mounting structure, easier mounting, a reduced number of steps for mounting, and improved yields. The present invention thus provides the effect of manufacturing a semiconductor package such as a CSP with reliability of mounting.

Since the bump for electrical connection and the adhesive resin having the adhesion function are formed on the semiconductor chip to realize reliable bonding, the present invention advantageously facilitates replacement after mounting to prevent expensive wiring substrates from being wasted.

In addition, the interposer is formed directly on the semiconductor wafer to reduce the number of steps for manufacturing the interposer and the material cost of the interposer. Thus, the present invention produces the effect of being capable of providing various semiconductor packages at low cost.

The present invention advantageously provides a high-density packaging multi chip module with high reliability and at low cost by using a plurality of HDPs such that they are partially bonded to each other or they are laminated and bonded to each other.

Furthermore, since the bump and the adhesive resin are formed on the semiconductor chip as a wafer, efficient manufacture can be performed.

Since the semiconductor device is previously provided with the adhesive resin, electrical connection and adhesion to a BGA substrate or the like can be simultaneously performed by thermocompression bonding or reflow processing in combination with a thermosetting flux when the semiconductor device is mounted on the BGA substrate or the like, thereby leading to favorable efficiency of manufacture.

Moreover, the present invention can readily support flexible manufacturing since the wire bonding technique is applicable to the bump formation.

BRIEF DESCRIPTION OF THE DRAWINGS

FIGS. 1(a), (b) are cross sections showing semiconductor devices of conventional examples;

FIG. 5(a) is a cross section showing a semiconductor device according to Embodiment 2 of the present invention, and FIG. 5(b) is a cross section showing a semiconductor device according to Embodiment 3 of the present invention;

FIG. 6 is a cross section showing a semiconductor device according to Embodiment 4 of the present invention;

FIG. 7 is a cross section showing a semiconductor device according to Embodiment 5 of the present invention;

FIGS. 8(a) to (d) are cross sections illustrating steps for describing a semiconductor device according to Embodiment 6 of the present invention and a manufacturing method thereof;

FIGS. 9(a) and (b) are cross sections illustrating applications of the semiconductor device according to Embodiment 6 of the present invention;

FIGS. 10 (a) and (b) are cross sections showing other applications of the semiconductor device according to Embodiment 6 of the present invention;

FIG. 11(b) is a perspective view showing a semiconductor device according to Embodiment 8 of the present invention, and FIG. 11(c) is a cross section taken along the A face in FIG. 11(b);

DESCRIPTION OF THE PREFERRED EMBODIMENTS

Semiconductor devices and manufacturing methods thereof according to preferred embodiments of the present invention are hereinafter described with reference to the accompanying drawings. The following description shows illustrative embodiments of the present invention and does not intend to limit the scope of the present invention.

Embodiment 1

A semiconductor device and a manufacturing method thereof according to Embodiment 1 of the present invention are first described with reference to FIGS. 4(a) to (d). FIGS. 4(a) to (d) are cross sections illustrating steps for describing the semiconductor device and the manufacturing method of Embodiment 1 of the present invention.

Figure 2A:
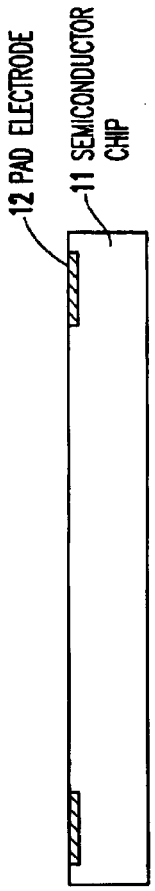
FIGS. 2(a) to (d) are cross sections illustrating steps for describing a semiconductor device of a conventional example and a manufacturing method thereof.
Figure 2B:
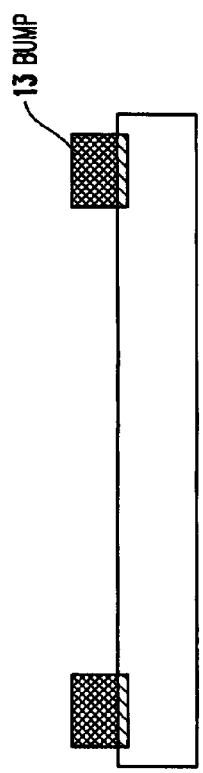
Figure 2C:
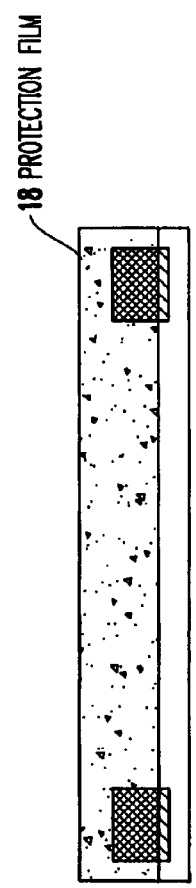
Figure 2D:
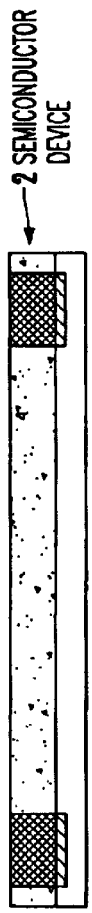
Figure 3:
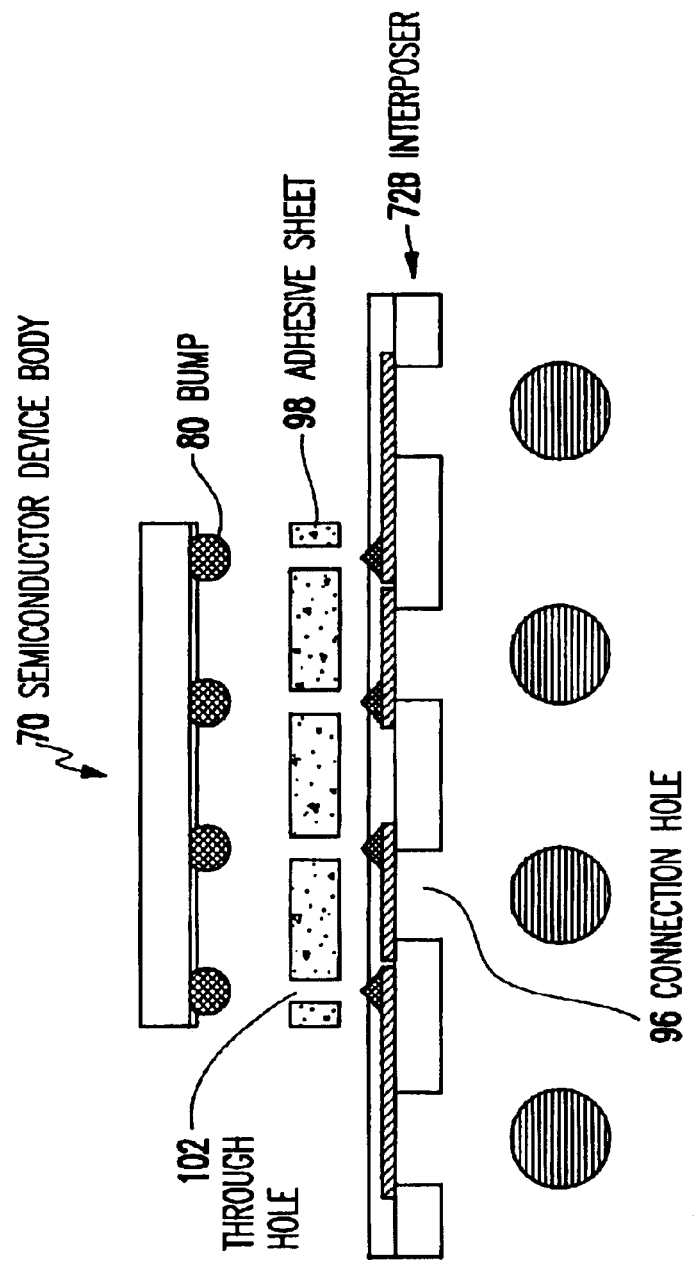
FIG. 3 is a cross section for describing a semiconductor device of a conventional example and a manufacturing method thereof.
Figure 4A:
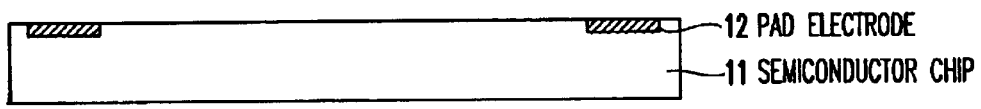
FIGS. 4(a) to (d) are cross sections illustrating steps for describing a semiconductor device according to Embodiment 1 of the present invention and a manufacturing method thereof.
Figure 4B:
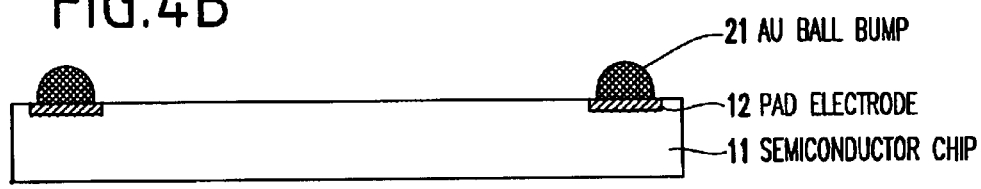
Figure 4C:
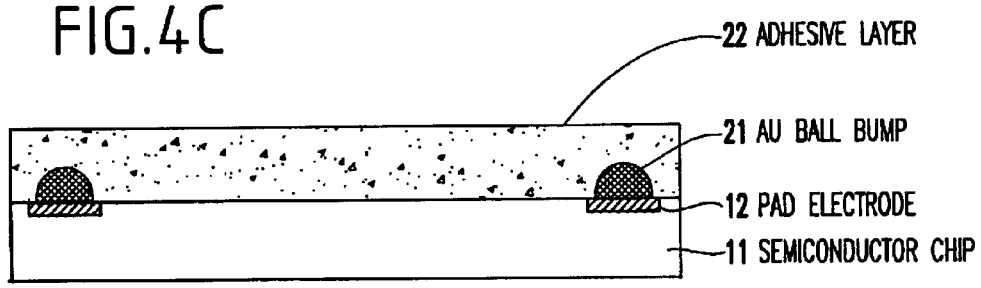
Figure 4D:
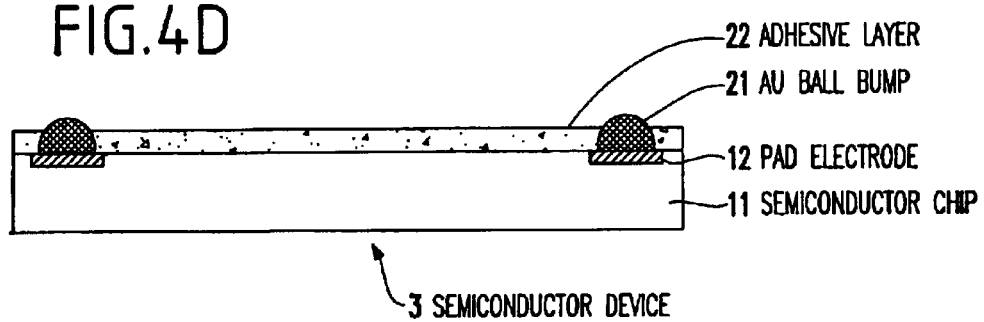

As shown in FIG. 4(d), semiconductor device 3 (HDP: High Density Package) of Embodiment 1 comprises semiconductor chip 11, Au ball bumps 21 provided on pad electrodes 12 with a stud bump method, and thermoplastic adhesive layer 22 disposed on the surface of semiconductor chip 11 on which pad electrodes 12 are formed such that the tops of Au ball bumps 21 project from the surface of adhesive layer 22.

While adhesive layer 22 is formed of a thermoplastic adhesive in consideration of replacement of a defective item after adhesion, a thermosetting adhesive may be used instead of the thermoplastic adhesive if such replacement is not required.

Semiconductor device 3 is manufactured as follows. FIGS. 4(a) to (d) are enlarged views showing one particular semiconductor chip 11 formed in semiconductor wafer 20.

After a predetermined number of semiconductor chips 11 are manufactured in semiconductor wafer 20, Au ball bumps 21 are provided on pad electrodes 12 of each semiconductor chip 11. Au ball bumps 21 are stud bumps formed with the stud bump method which is an application of the wire bonding technique. Specifically, a wire bonding apparatus is used to form a gold ball at the end of a gold wire extending from a capillary and the gold ball is pressed against pad electrode 12. The capillary is ultrasonically vibrated to ultrasonically weld the gold ball to pad electrode 12 and then the gold wire is cut. As above, Au ball bumps 21 are formed on pad electrodes 12 (FIG. 4(b)).

Next, a thermoplastic PI resin, for example, is applied at a thickness of approximately 50 μm to the surface on which Au ball bumps 21 are disposed, and the resin is cured temporarily to the extent that fluidity is lost to provide adhesive layer 22 (FIG. 4(c)).

Next, the entire surface of adhesive layer 22 is immersed in an etchant such as KOH or N2H4 (hydrazine) to perform etching until the tops of Au ball bumps 21 project from the surface (FIG. 4(d)).

Semiconductor device 3 before isolation is obtained through the aforementioned steps. Thereafter, semiconductor wafer 20 is cut for division into semiconductor devices 3 for use in the next step, or used in the next step as it is, as later described.

Embodiment 2

Next, a semiconductor device and a manufacturing method thereof according to Embodiment 2 of the present invention are described with reference to FIG. 5(a). FIG. 5(a) is a cross section showing the semiconductor device of Embodiment 2 of the present invention.

The semiconductor device shown in FIG. 5(a) is a semiconductor device (BGA type semiconductor package) in which semiconductor device 3 is bonded to wiring tape 23 as an interposer through thermocompression bonding and resin molding is performed. For manufacturing, semiconductor wafer 20 (see FIG. 4) is first cut for division into individual semiconductor devices 3.

Next, one, or two or more semiconductor devices 3 are mounted on one wiring tape 23, and heating and pressing are performed to establish adhesion to wiring tape 23 with adhesive layer 22 and electrical connection to copper wiring 24 on wiring tape 23 with Au ball bumps 21. Such adhesion and connection may be performed as follows.

Wiring tape 23 used in this case is configured such that copper wiring 24 is supported by insulating film 25 at the positions corresponding to pad electrodes 12, i.e. such that holes for applying a bonding tool are not provided in insulating film 25 at the positions corresponding to pad electrodes 12. This is because Embodiment 2 does not employ a single point bonding method with a bonding tool.

Wiring tape 23 is first disposed on a silicon sheet (not shown) with a thickness of approximately 0.2 to 1.0 mm, and semiconductor device 3 is positioned and mounted on Au plated pads 26 on copper wiring 24. Then, a vacuum is produced for the surrounding atmosphere.

In the vacuum atmosphere, a heater plate (not shown) is pulled down from above and pressed against the backs (the opposite sides of the surfaces on which the electrodes are formed) of a number of semiconductor chips 11. Thus, wiring tape 23 is pressed against almost the entire surface of each semiconductor chip 11 on which pad electrodes 12 are formed while heat is added to adhesive layer 22 and an inner lead connecting portion including Au ball bumps 21.

At this point, since copper wiring 24 is supported by insulating film 25 at the positions corresponding to pad electrodes 12, the pressing force of the heater plate is reliably transferred to the inner lead connecting portion. The pressing performed in the vacuum prevents accumulation of air between semiconductor chip 11 and adhesive layer 22 to allow satisfactory adhesion.

It is preferable to previously select values for heating and pressing to achieve optimal adhesion of adhesive layer 22 and values for heating and pressing to achieve optimal metal junction with Au ball bumps 21 such that both have the same values. This allows application of heat and a pressing force to both adhesive layer 22 and the inner lead connecting portion without excess or lack to achieve a favorable adhesion state and a favorable metal junction state.

Au ball bumps 21 are melted and adhesive layer 22 is cured as described above, thereby completing the metal junction between Au plated pads 26 and Au ball bumps 21 and the adhesion of semiconductor chip 11 to wiring tape 23 with adhesive layer 22. As a result, a favorable adhesion state and a favorable metal junction state can be obtained. The vacuum atmosphere produces no voids between the surface of semiconductor chip 11 on which pad electrodes 12 are formed and adhesive layer 22. As the size of a chip becomes larger, concern about voids increases. In such a case, adhesion in the vacuum atmosphere is effective as in the embodiment.

Au plated pads 26 may be bonded to Au ball bums 21 to readily establish electrical conduction under conditions, for example, at 270° C., for 10 seconds, and at 980 mN/bump. In this case, it is desirable to select the composition of the adhesive for use in adhesive layer 22, the thickness of adhesive layer 22 and the like, such that adhesive layer 22 preferably adheres semiconductor chip 11 to wiring tape 23 under conditions, for example, at 270° C., for 10 seconds, and at 980 mN/bump.

Then, the wiring tape on which semiconductor device 3 is mounted is transferred to a resin molding apparatus and put in a mold, and the surface of wiring tape 23 to which semiconductor device is bonded is sealed by a resin. In addition, sealing resin 27 is cured, cover resist 50 is formed, solder balls 31 are formed, and dicing into individual packages is performed. With the aforementioned steps, the semiconductor device (BGA type semiconductor package) shown in FIG. 5(a) is obtained.

While FIG. 5(a) shows a single chip package, a plurality of semiconductor devices 3 may be arranged in a single package to provide a multi chip package.

Another effective manufacturing process is that, before semiconductor wafer 20 is cut for division into individual semiconductor devices 3, semiconductor wafer 20 is adhered to wiring tape 23 through adhesive layer 22 and then semiconductor chip 11 is cut along its perimeter for division into individual pieces. In this case, a resulting semiconductor package is configured such that each end face of semiconductor chip 11 is flush with each end face of wiring tape 23 as the same cut surface.

Embodiment 3

Next, a semiconductor device and a manufacturing method thereof according to Embodiment 3 of the present invention are described with reference to FIG. 5(b). FIG. 5(b) is a cross section showing the semiconductor device of Embodiment 3 of the present invention.

The semiconductor device shown in FIG. 5(b) comprises semiconductor chip 11, adhesive layer 22 as a protection resin layer provided on the surface on which pad electrodes 12 are formed, Au ball bums 21 formed on pad electrodes 12 and exposed at the surface of adhesive layer 22, and wiring tape 23 adhered to the surface of adhesive layer 22 through cured flux 28 and serving as an interposer for electrical connection to Au ball bumps 21. The semiconductor device is a semiconductor device (BGA type semiconductor package) manufactured by bonding semiconductor device 3 to wiring tape 23 with thermocompression bonding and performing resin molding.

For manufacture, semiconductor wafer 20 (see FIG. 4) is first cut for division into individual semiconductor chips 11. For one, or two ore more semiconductor chips 11, thermosetting flux 28 is applied to Au ball bums 21 and adhesive layer 22, or thermosetting flux 28 is applied to wiring tape 23 corresponding thereto.

Next, Au ball bumps 21 are disposed on solder plated pads 29 formed by solder plating of part of copper wiring 24 of wiring tape 23.

Subsequently, heating is performed through infrared heating, hot air heating or the like, and reflow processing is performed. In this manner, Au ball bumps 21 are soldered to solder plated pads 29 and thermosetting flux 28 is cured. Thermosetting flux 28 is used because the curing thereof bonds adhesive layer 22 to wiring tape 23. Thus, adhesive layer 22 may be replaced with a nonadhesive protection resin layer.

Thereafter, wiring tape 23 on which semiconductor device 3 is mounted is transferred to a resin molding apparatus and put in a mold, and the surface of wiring tape 23 to which semiconductor device 3 is bonded is sealed by a resin. In addition, sealing resin 27 is cured, cover resist 50 is formed, solder balls 31 are provided, and dicing into individual packages is performed. With the aforementioned steps, the semiconductor device (BGA type semiconductor package) shown in FIG. 5(b) is obtained.

While FIG. 5(b) shows a single chip package, a plurality of semiconductor devices 3 may be arranged in a single package to provide a multi chip package.

In addition, the following process on semiconductor wafer 20 is effective. Specifically, before semiconductor wafer 20 is cut, thermosetting flux 28 is applied to Au ball bumps 21 on semiconductor wafer 20 and adhesive layer 22, or thermosetting flux 28 is applied to wiring tape 23 corresponding thereto. Next, Au ball bumps 21 are disposed on solder plated pads 29 and heated to solder Au ball bums 21 to solder plated pads 29 and cure thermosetting flux 28. Then, semiconductor chip 11 is cut along its perimeter for division into individual pieces. In this case, a resulting semiconductor package is configured such that each end face of semiconductor chip 11 is flush with each end face of wiring tape 23 as the same cut surface.

Embodiment 4

Next, a semiconductor device and a manufacturing method thereof according to Embodiment 4 of the present invention are described with reference to FIG. 6. FIG. 6 is a cross section showing the semiconductor device of Embodiment 4 of the present invention.

The semiconductor device of Embodiment 4 is a multi chip module in which a plurality of semiconductor devices 3 are mounted on interposer 14 in the same manner as Embodiment 2, and heat spreader 32 is bonded to the back of semiconductor devices 3 through heat radiation pastes 30. Such a configuration can result in a multi chip module with a high level of heat radiation.

In addition, mounting may be performed with reflow using a thermosetting flux as in Embodiment 3. In such a case, solder plated pads receive Au ball bumps 21 and the thermosetting flux bonds adhesive layer 22 serving as a protection resin layer to copper wiring 15.

Embodiment 5

Next, a semiconductor device and a manufacturing method thereof according to Embodiment 5 of the present invention are described with reference to FIG. 7. FIG. 7 is a cross section showing the semiconductor device of Embodiment 5 of the present invention.

As shown in FIG. 7, the semiconductor device of Embodiment 5 is configured such that semiconductor device 3 is mounted on wiring tape 33 provided with device hole 34 as an interposer in the same manner as Embodiment 2. In addition, mounting may be performed with reflow using a thermosetting flux as in Embodiment 3. In such a case, solder plated pads receive Au ball bumps 21 and the thermosetting flux bonds adhesive layer 22 serving as a protection resin layer to copper wiring 35.

As shown in FIG. 7, adhesive layer 22 adheres to wiring tape 33 on the periphery of semiconductor device 3, and Au ball bumps 21 bonds to Au plated pads 36 on copper wiring 35 to establish electrical connection. The central portion of semiconductor device 3 is exposed through device hole 34.

According to the semiconductor device of Embodiment 5, device hole 34 provided in wiring tape 33 prevents the damage to the interface between wiring tape 33 and adhesive layer 22 due to a popcorn phenomenon. Since the surface of semiconductor chip 11 in the area corresponding to device hole 34 is resin sealed by adhesive layer 22, it is not necessary to fill or provide a protection resin such as an underfill after the semiconductor chip is mounted on the wiring tape.

Embodiment 6

Next, a semiconductor device and a manufacturing method thereof according to Embodiment 6 of the present invention are described with reference to FIGS. 8(a) to (d). FIGS. 8(a) to (d) are cross sections illustrating steps for describing the semiconductor device and the manufacturing method of Embodiment 6 of the present invention.

Figure 8C:
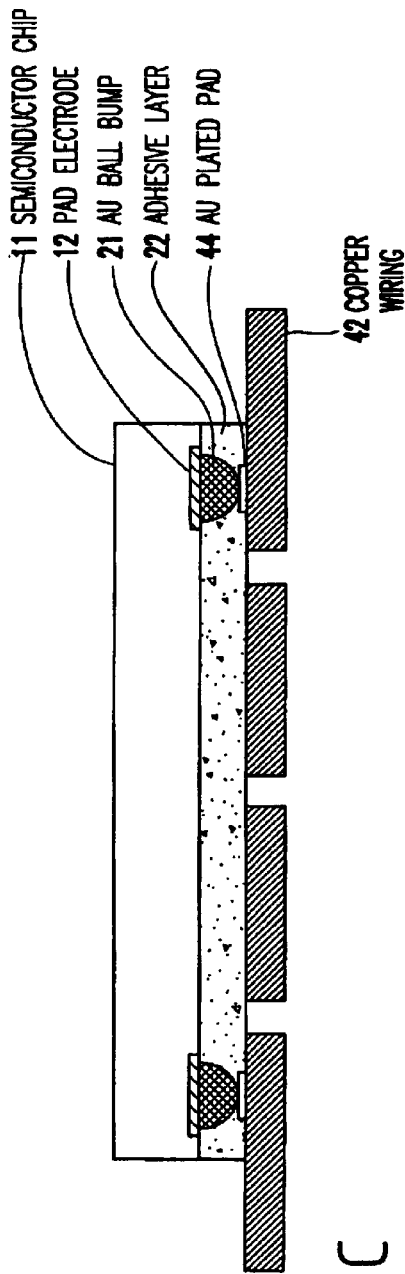
Figure 8D:
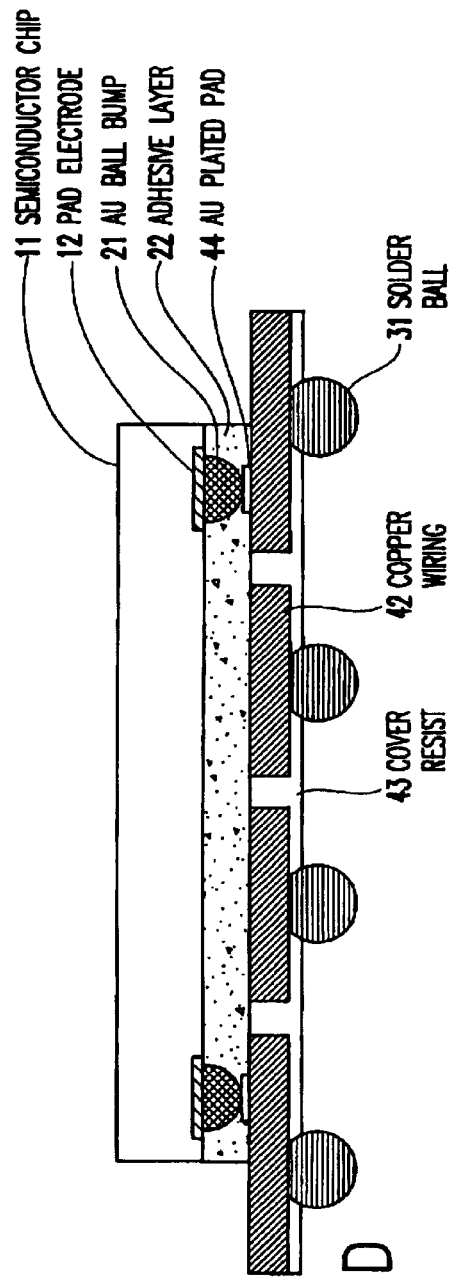

As shown in FIG. 8(d), the semiconductor device of Embodiment 6 comprises semiconductor device 3 including semiconductor chip 11, adhesive layer 22 disposed on the surface on which pad electrodes 12 are formed, and Au ball bumps 21 provided on pad electrodes 12 and exposed at the surface of adhesive layer 22, copper wiring 42 adhered to the surface of adhesive layer 22 and bonded partially to Au ball bumps 21, and cover resist 43 serving as an insulating and covering layer for insulating and covering copper wiring 42 and selectively opening to form an external connecting portion. The semiconductor device is a BGA type semiconductor package having solder balls 31 formed as external terminals. Au ball bumps 21 establish Au—Au metal junction with Au plated pads 44 on copper wiring 42.

The semiconductor device of Embodiment 6 is manufactured as follows. As shown in FIG. 8(a), copper foil 41, for example with a thickness of 50 μm, is first prepared.

Copper foil 41 is aligned with semiconductor device 3 through adhesive layer 22, and heating and pressing are performed by a heater plate in a vacuum atmosphere in the same manner as Embodiment 2. Thus, adhesive layer 22 adheres semiconductor device 3 to copper foil 41, and Au ball bumps 21 are bonded to copper foil 41 through Au plated pads 44 to establish electrical connection.

After semiconductor chip 11 is bonded to copper foil 41 through adhesive layer 22 in this manner, copper foil 41 is formed into a predetermined pattern through a lithography technique to obtain copper wiring 42.

Next, cover resist 43 is applied as an insulating and covering layer to copper wiring 42, and exposure and development are performed to form openings therein, thereby exposing land portions of copper wiring 42 for disposing solder balls 31.

Finally, solder balls 31 are mounted and provided on the land portions through reflow.

With the aforementioned steps, the semiconductor device of Embodiment 6 (BGA type semiconductor package) is completed.

Another effective manufacturing process is that semiconductor wafer 20 (see FIG. 4) having semiconductor devices 3 formed therein before isolation is aligned with copper foil 41 through adhesive layer 22, heating and pressing are performed to achieve adhesion to copper foil 41 with adhesive layer 22 and electrical connection to copper foil 41 with Au ball bumps 21, copper foil 41 is formed into a wiring pattern, and then semiconductor wafer 20 is cut along the perimeter of semiconductor chips 11 for division into individual pieces. In this case, a resulting BGA type semiconductor package has the same size as the outer size of the package or the outer size of semiconductor chip 11.

In the same manner as Embodiment 3, semiconductor wafer 20 having semiconductor device 3 or many semiconductor devices 3 formed therein may be bonded to copper foil 41 with reflow using a thermosetting flux. In such a case, solder plated pads receive Au ball bumps 21 and the thermosetting flux bonds adhesive layer 22 serving as a protection resin layer to copper foil 41.

As shown in FIG. 9(a), resin molding may be performed such that sealing resin 27 seals semiconductor device 3. This protects semiconductor chip 11.

In addition, as shown in FIG. 9(b), another usable configuration is that heat spreader 40 having a ceiling portion and a wall portion is connected to semiconductor chip 11 through heat radiation paste 45 such that the inner surface of the ceiling portion is bonded to the back of semiconductor chip 11, and the lower ends of the wall portion are bonded to cover resist 43 filled between copper wirings 42 by heat spreader fixing adhesive 46. This provides a higher level of heat radiation.

In addition, as shown in FIG. 10(a), it is possible to use a multi chip module manufactured by bonding semiconductor devices 3a, 3b including different kinds of semiconductor chips 11a, 11b onto the same copper foil, and moreover, the multi chip module may be resin molded to seal semiconductor devices 3a, 3b by sealing resin 47. This protects semiconductor chips 11.

Embodiment 7

Figure 11A:
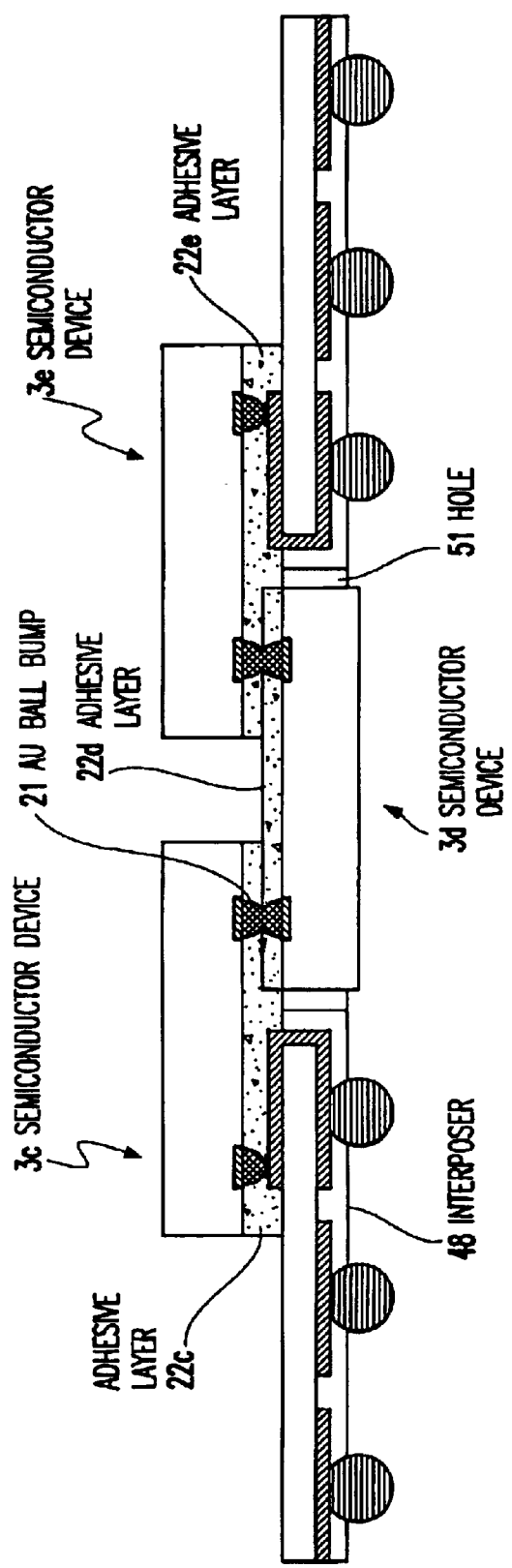
FIG. 11(a) is a cross section showing a semiconductor device according to Embodiment 7 of the present invention.

Next, a semiconductor device and a manufacturing method thereof according to Embodiment 7 of the present invention are described with reference to FIG. 11(a). FIG. 11(a) is a cross section showing the semiconductor device of Embodiment 7 of the present invention.

The semiconductor device of Embodiment 7 is a multi chip module comprising three semiconductor devices 3c, 3d, and 3e in which part of the surface of semiconductor device 3c on which adhesive layer 22c is provided is adhered to part of the surface of semiconductor device 3d on which adhesive layer 22d is provided, they are electrically connected to each other at the bonding surface by Au ball bumps 21, part of the surface of semiconductor device 3e on which adhesive layer 22e is provided is adhered to part of the surface of semiconductor device 3d on which adhesive layer 22d is provided, and they are electrically connected to each other at the bonding surface with Au ball bumps 21.

Interposer 48 is bonded to the area of the surface of semiconductor device 3c on which adhesive layer 22c is provided except the bonding surface to semiconductor device 3d and to the area of the surface of semiconductor device 3e on which adhesive layer 22e is provided except the bonding surface to semiconductor device 3d, and Au ball bumps 21 are bonded to leads of interposer 48 in those areas for mounting. Semiconductor device 3d is inserted into hole 51 provided in interposer 48.

The shown structure may be protected by resin sealing.

Embodiment 8

A semiconductor device and a manufacturing method thereof according to Embodiment 8 of the present invention are described with reference to FIGS. 11(b) and 11(c). FIG. 11(b) is a perspective view showing the semiconductor device of Embodiment 8 of the present invention, while FIG. 11(c) is a cross section taken along the A face in FIG. 11(b).

The semiconductor device of Embodiment 8 is a multi chip module comprising two semiconductor devices 3f, 3g in which part of the surface of semiconductor device 3g on which adhesive layer 22g is provided is adhered to the entire surface of semiconductor device 3f on which adhesive layer 22f is provided and they are electrically connected to each other at the bonding surface with their Au ball bumps 21 as shown in FIG. 11(c).

An interposer (not shown) is bonded to the areas of the surface of semiconductor device 3g on which adhesive layer 22g is provided except the bonding surface to semiconductor device 3f (the areas present on both sides of semiconductor device 3f in FIGS. 11(b), 11(c)), and Au ball bumps 21a are bonded to leads of the interposer in those areas for mounting. Semiconductor device 3f is inserted into a hole provided in the interposer in the same manner as Embodiment 7.

In addition, resin sealing may be performed for protection.

Embodiment 9

Figure 12:
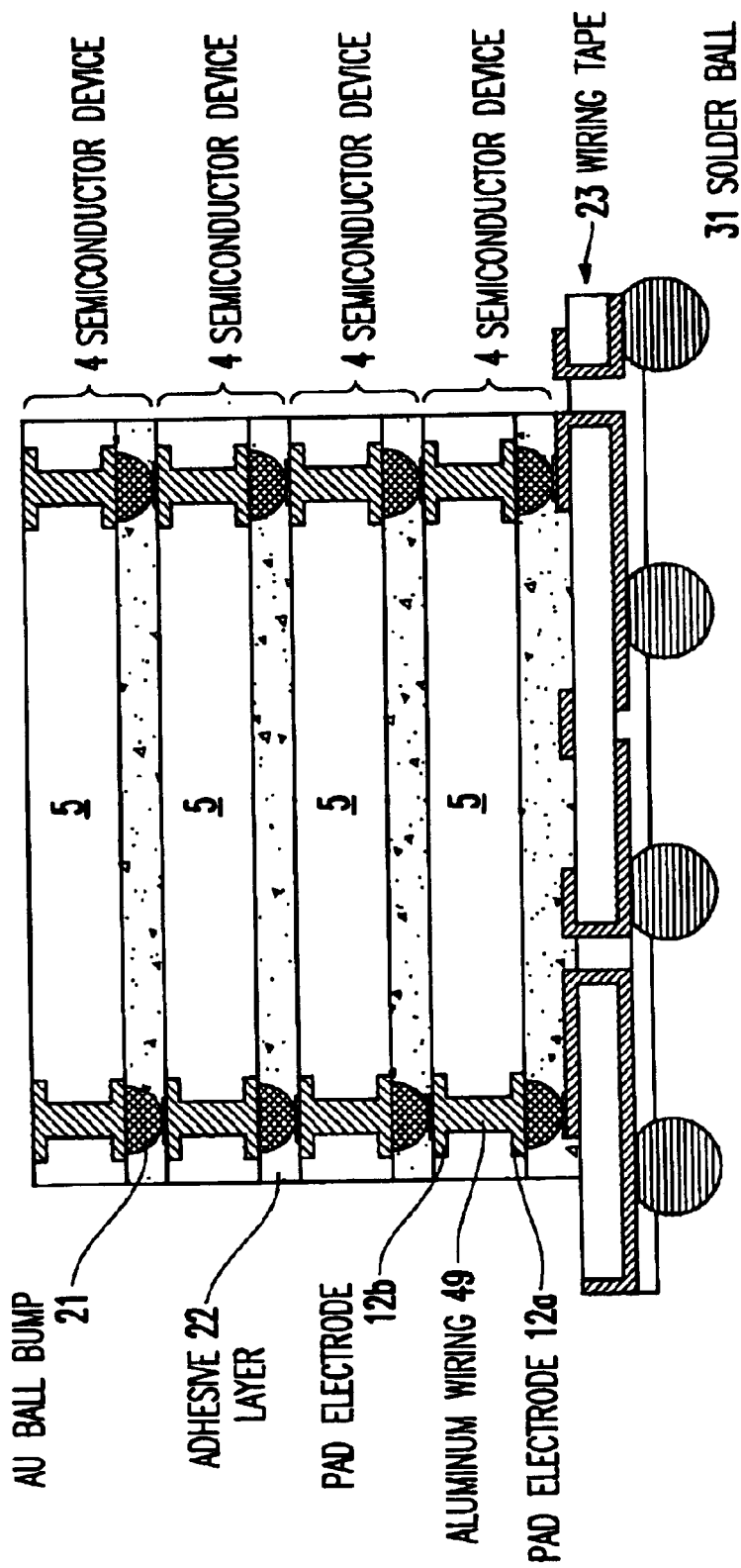
FIG. 12 is a cross section showing a semiconductor device according to Embodiment 9 of the present invention.

Next, a semiconductor device and a manufacturing method thereof according to Embodiment 9 of the present invention are described with reference to FIG. 12. FIG. 12 is a cross section showing the semiconductor device of Embodiment 9 of the present invention.

Similarly to Embodiment 2, semiconductor device 4 is bonded to wiring tape 23.

Semiconductor device 4, however, is configured to include semiconductor chip 5 having pad electrodes formed on the front and back, unlike semiconductor device 3 used in Embodiment 2. Electrical conduction is established between front pad electrode 12a and back pad electrode 12b through aluminum wiring 49.

The semiconductor device of Embodiment 9 is a multi chip module in which four semiconductor devices 4 are stacked by adhesion through adhesive layers 22, and Au ball bumps 21 of one semiconductor device 4 are bonded to pad electrodes 12b on the back surface of semiconductor device 4 below for electrical connection. The semiconductor device has a high packaging density and high reliability of bonding with adhesive layers 22.

In addition, resin sealing may be performed for protection.

While the manufacturing methods of a semiconductor device according to the aforementioned embodiments of the present invention employ the stud bump method which is an application of the wire bonding technique to form bumps, a plating method may be used instead. In such a case, plated bumps are formed as follows. Specifically, a resist is applied to semiconductor wafer 20, and exposure and development are performed to form a resist pattern having openings on pad electrodes 12. Next, metal is deposited in the openings though the plating method to form bumps. Then, the resist is removed. The plating method is suitable for mass production, while the stud bump method is suitable for flexible manufacturing. Whether the stud bump method or plating method is used depends on the quantity of manufacture.

The material of the bumps formed on the chip is not limited to Au, and Cu, Pb—Sn or the like may be used as the material.

Embodiment 10

Figure 13:
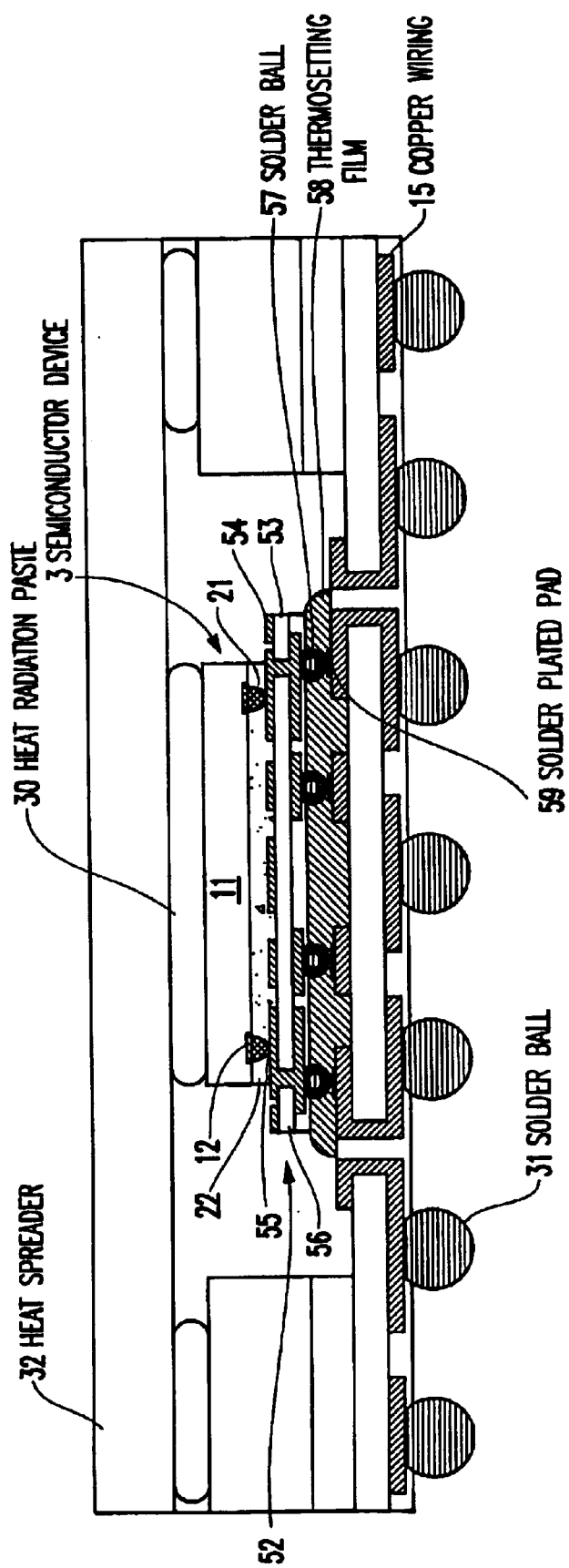
FIG. 13 is a cross section showing a semiconductor device according to Embodiment 10 of the present invention.

Next, a semiconductor device and a manufacturing method thereof according to Embodiment 10 of the present invention are described with reference to FIG. 13. FIG. 13 is a cross section showing the semiconductor device of Embodiment 16 of the present invention.

As shown in FIG. 13, the semiconductor device of Embodiment 10 comprises semiconductor device 3, tape substrate 52, and interposer 14, in which semiconductor device 3 is mounted on interposer 14 through tape substrate 52.

Tape substrate 52 is a wiring tape in tape carrier shape obtained by forming copper wiring 54 in a predetermined pattern through a lithography technique on the front and back of insulating film 53 made of polyimide. Insulating film 53 is provided with through-holes for allowing electrical conduction between copper wirings 54 on the front and back. Au plated pads 55 are provided on part of copper wiring 54 formed on the surface of tape substrate 52. Copper wiring 54 formed on the back of tape substrate 52 is insulated by and covered with cover resist 56 except land portions.

Semiconductor device 3 is adhered to the surface of tape substrate 52 with adhesive layer 22 and electrical connection is made between them through Au ball bumps 21. Each Au ball bump 21 is disposed on pad electrode 12 of semiconductor chip 11 and has one end connected to pad electrode 12 and the other end connected to Au plated pad 55. Adhesive layer 22 provides sealing between semiconductor chip 11 and tape substrate 52, and sealing even of Au ball bumps 21 for ensuring reliable mounting. Adhesive layer 22 also functions to protect the surface of semiconductor chip 11.

Solder balls 57 are provided on the land portions of copper wiring 54 of the back of tape substrate 52. Each solder ball 57 has one end connected to the land portion of copper wiring 54 and the other end connected to solder plated pad 59 formed by solder plating on interposer 14 for electrically connecting tape substrate 52 with interposer 14. Cured thermosetting flux 58 is filled between tape substrate 52 and interposer 14 around solder balls 57 for reinforcing the junction between tape substrate 52 and interpose 14 to ensure reliable mounting.

On the other hand, heat radiation paste 30 is applied to the back of semiconductor chip 11 and heat spreader 32 is adhered to semiconductor chip 11 through heat radiation paste 30.

The semiconductor device of Embodiment 10 is manufactured as follows.

Semiconductor device 3 is first manufactured as described in Embodiment 1.

Next, semiconductor device 3 is thermocompression-bonded to the surface of tape substrate 52 as in Embodiment 2.

In this case, mounting may be performed with reflow using a thermosetting flux as in Embodiment 3.

Next, solder balls 57 are provided on the land portions on the back of tape substrate 52.

Thermosetting flux 58 is then applied to the back of tape substrate 52 or the bonding area of interposer 14.

Then, tape substrate 52 to which semiconductor device 3 is adhered is mounted on interposer 14, heating is performed with infrared heating, hot air heating or the like, and reflow processing is performed. In this manner, solder balls 57 are soldered to solder plated pads 59 and thermosetting flux 58 is cured.

Heat radiation paste 30 is applied to the back of semiconductor chip 11 and thereabout, and heat spreader 32 is adhered, thereby completing the semiconductor device of Embodiment 10 as a multi chip package.

In a conventional BGA type semiconductor package of a flip chip method, an expensive build-up BT substrate is used as an interposer to accommodate an extremely small pad pitch of 200 μm of a semiconductor chip.

According to the semiconductor device of Embodiment 10, however, tape substrate 52 for allowing a fine pitch at low cost is interposed between semiconductor chip 11 and interposer 14, and solder balls 57 as external terminals with a larger pitch (for example, 500 μm) than the pad pitch (for example, 200 μm) of semiconductor chip 11 are provided on the back. Thus, it is not necessary for interposer 14 to accommodate a fine pitch and an inexpensive wiring substrate can be used as interposer 14.

Since tape substrate 52 itself is inexpensive, a semiconductor package can be formed in total at a lower cost than one using a build-up BT substrate.

What is claimed is:

1. A semiconductor device comprising:

a semiconductor chip;

a stud bump provided on an electrode of said semiconductor chip;

an adhesive layer provided on a surface of said semiconductor chip on which said electrode is formed; and an interposer bonded to said adhesive layer, wherein said adhesive layer comprises a thermocompressive adhesive, wherein said adhesive layer comprises an adhesive surface facing away from said semiconductor chip, and wherein said stud bump projects from said adhesive surface of said adhesive layer.

2. The semiconductor device according to claim 1, wherein said interposer is provided with a device hole.

3. A semiconductor device comprising:

a semiconductor chip;

an adhesive layer provided on a surface of said semiconductor chip on which an electrode is formed;

a bump provided on said electrode of said semiconductor chip and exposed at a surface of said adhesive layer; and an interposer adhered to said surface of said adhesive layer through a cured flux and electrically connected to said bump, wherein said adhesive layer comprises an adhesive surface facing away from said semiconductor chip.

4. A semiconductor device comprising:

a semiconductor chip;

an adhesive layer formed on a surface of said semiconductor chip on which an electrode is formed;

a bump provided on said electrode of said semiconductor chip and projecting from a surface of said adhesive layer;

a wiring pattern adhered to said surface of said adhesive layer and partially bonded to said bump; and an insulating and covering layer for insulating and covering said wiring pattern and selectively opening to form an external connecting portion, wherein said adhesive layer comprises an adhesive surface facing away from said semiconductor chip.

5. A semiconductor device comprising:

a semiconductor chip;

an adhesive layer provided on a surface of said semiconductor chip on which an electrode is formed;

a bump provided on said electrode of said semiconductor chip and exposed at a surface of said adhesive layer;

a wiring pattern adhered to said surface of said adhesive layer through a cured flux and partially bonded to said bump; and an insulating and covering layer for insulating and covering said wiring pattern and selectively opening to form an external connecting portion, wherein said adhesive layer comprises an adhesive surface facing away from said semiconductor chip.

6. A semiconductor apparatus comprising:

two or more semiconductor devices, each of said devices comprising:

a semiconductor chip;

an adhesive layer provided on a surface of said semiconductor chip on which an electrode is formed; and a bump provided on said electrode of said semiconductor chip and projecting from a surface of said adhesive layer, wherein part of a surface of one of said semiconductor devices on which said adhesive layer is provided is adhered to part or all of a surface of another one of said semiconductor devices on which said adhesive layer is provided and said one and said another one of said semiconductor devices are electrically connected to each other with said bumps at the adhesion surface, and wherein said adhesive layer comprises an adhesive surface facing away from said semiconductor chip.

7. A semiconductor apparatus comprising:

two or more stacked semiconductor devices, each of said devices comprising:

a semiconductor chip having electrodes formed on the front and back;

an adhesive layer provided on the front or back of said semiconductor chip; and a bump provided on said electrode of said semiconductor chip and exposed at a surface of said adhesive layer, wherein one of said semiconductor devices is adhered to an underlaying one of said semiconductor devices through said adhesive layer and the electrodes thereof are connected to each other through said bump.

8. A semiconductor device comprising:

a semiconductor chip;

an adhesive layer provided on a surface of said semiconductor chip on which an electrode is formed;

a bump provided on said electrode of said semiconductor chip and exposed at a surface of said adhesive layer;

a tape substrate; and an interposer, wherein said semiconductor chip is adhered to the front of said tape substrate with said adhesive layer, said semiconductor chip is electrically connected to said tape substrate with said bump, and said interposer is connected to the back of said tape substrate for allowing electrical conduction.

9. A semiconductor device comprising:

a semiconductor chip;

a stud bump provided on an electrode of said semiconductor chip; and an adhesive layer provided on a surface of said semiconductor chin on which said electrode is formed, wherein said adhesive layer comprises an adhesive surface facing away from said semiconductor chip, wherein said stud bump projects from said adhesive surface of said adhesive layer;

wherein said adhesive layer comprises a thermoplastic resin having a thickness of 50 $\mu$m.

* * * * *